(12) United States Patent
Ralph et al.

(10) Patent No.: US 9,960,836 B2
(45) Date of Patent: May 1, 2018

(54) METHOD AND SYSTEM FOR SATELLITE USING MULTIFUNCTIONAL MOTHERBOARD

(71) Applicant: L-3 Communications Corporation, New York, NY (US)

(72) Inventors: Loren Edward Ralph, Citrus Heights, CA (US); Eddie Rodgers, Folsom, CA (US); James H. Roberson, Placerville, CA (US)

(73) Assignee: L-3 Technologies, Inc., New York, NY (US)

( * ) Notice: Subject to any disclaimer, the term of this patent is extended or adjusted under 35 U.S.C. 154(b) by 0 days. days.

(21) Appl. No.: 15/312,603

(22) PCT Filed: Oct. 14, 2014

(86) PCT No.: PCT/US2014/060550
§ 371 (c)(1),
(2) Date: Nov. 18, 2016

(87) PCT Pub. No.: WO2015/178953
PCT Pub. Date: Nov. 26, 2015

(65) Prior Publication Data
US 2017/0187451 A1 Jun. 29, 2017

Related U.S. Application Data

(60) Provisional application No. 62/000,509, filed on May 19, 2014.

(51) Int. Cl.
*H04B 7/185* (2006.01)
*H04W 4/00* (2009.01)
*H05K 1/02* (2006.01)

(52) U.S. Cl.
CPC ....... *H04B 7/18515* (2013.01); *H05K 1/0243* (2013.01)

(58) Field of Classification Search
CPC .................................................. H04B 7/18515
(Continued)

(56) References Cited

U.S. PATENT DOCUMENTS

| 3,825,861 A | 7/1974 | O'Donnell |
| 4,425,639 A | 1/1984 | Acampora et al. |

(Continued)

FOREIGN PATENT DOCUMENTS

| CN | 86204034 U | 8/1986 |
| EP | 0 804 061 A1 | 10/1997 |

(Continued)

OTHER PUBLICATIONS

Patent Abstracts of Japan for JP 2000-338601, Aug. 15, 2000.
(Continued)

*Primary Examiner* — Tilahun B Gesesse
(74) *Attorney, Agent, or Firm* — Tiajoloff & Kelly LLP

(57) ABSTRACT

A satellite is configured for use in space so as to receive RF signals, convert them to a different frequency range, and retransmit the converted RF signals. The satellite comprises a payload area supporting a motherboard structure with a plurality of frequency converters supported on it. The frequency converters are each connected with an antenna system of the satellite so that each of them receives a respective RF input signal. A local oscillator source supported on said motherboard structure generates a local oscillator signal, and a motherboard in the motherboard structure receives the local oscillator signal and transmits it through the motherboard to each of the frequency converters. The frequency converters each convert the respective RF input signal to a respective RF output signal using the
(Continued)

local oscillator signal and transmit the RF output signal to the antenna system so as to be transmitted wirelessly.

21 Claims, 21 Drawing Sheets

(58) Field of Classification Search
USPC .................................... 455/12.1, 13.1, 13.3
See application file for complete search history.

(56) References Cited

U.S. PATENT DOCUMENTS

| | | | |
|---|---|---|---|
| 4,461,041 | A | 7/1984 | Dobrovolny |
| 5,422,647 | A | 6/1995 | Hirshfield et al. |
| 5,423,080 | A | 6/1995 | Perret et al. |
| 5,548,292 | A | 8/1996 | Hirshfield et al. |
| 5,623,269 | A | 4/1997 | Hirshfield et al. |
| 5,671,220 | A | 9/1997 | Tonomura |
| 5,905,943 | A * | 5/1999 | Wiedeman ......... H04B 7/18513 455/11.1 |
| 5,963,845 | A | 10/1999 | Floury et al. |
| 6,456,824 | B1 | 9/2002 | Butte et al. |
| 6,583,677 | B2 | 6/2003 | Shintani et al. |
| 6,797,890 | B2 | 9/2004 | Okubora et al. |
| 6,847,275 | B2 | 1/2005 | Sayanagi et al. |
| 6,946,989 | B2 | 9/2005 | Vavik |
| 7,005,932 | B2 | 2/2006 | Shih |
| 7,076,201 | B2 * | 7/2006 | Ammar ............. H04B 7/18528 455/127.2 |
| 2005/0242994 | A1 | 11/2005 | Cobb et al. |
| 2007/0231951 | A1 | 10/2007 | Suryakumar |
| 2008/0169958 | A1 * | 7/2008 | Cohen ................. G01S 19/015 342/14 |
| 2011/0001668 | A1 | 1/2011 | Cobb et al. |

FOREIGN PATENT DOCUMENTS

| | | |
|---|---|---|
| EP | 1 1 33 076 A1 | 9/2001 |
| JP | 2000-228601 | 8/2000 |
| RU | 77 128 U1 | 10/2008 |
| WO | 2007/009729 A1 | 1/2007 |
| WO | 2008/105778 A2 | 9/2008 |

OTHER PUBLICATIONS

English Language Abstract of CN86204034, Aug. 28, 1986.
Machine Translation of RU 77 128 U1, Oct. 10, 2008.
M.E. Fraeman, "A Fault Tolerant Integrated Electronics Module for Small Satellites", 11th AIAA/USU Conference on Small Satellites, 1997.
Ji-Xin Chen et al., "Development of a Low Cost Microwave Mixer Using a Broad-band Substrate Integrated Waveguide (SIW) Coupler". IEEE Microwave and Components Letters, vol. 16, No. 2, Feb. 2006. p. 84-86.
W.J. Blackwell et al., "Nanosatellites for Earth Environmental Monitoring: The MicroMAS Project", 26th Annual AIAA/USU Conference on Small Satellites, 2012, p. 1-11.
J. Coonrod, "Navigating Multilayer Microwave PCB Tradeoffs", MicroWaves & RF, May 2012. p. 107-114.
D. Mead, "The Navy's New Communication Satellites Have 16 Times More Bandwidth Than the Old Ones". http://motherboard.vice.com/blog/the-navys-new-communications-satellites. Jul. 19, 2013.
D. Sakoda, et al., "Overview of the NPS Spacecraft Architecture and Technology Demonstration Satellite, NPSAT1", 16th Annual AIAA/USU Conference on Small Satellites, 2002.
M. Bozzi, et al., "Review of Substrate-Integrated Waveguide Circuits and Antennas", IET Microwave Antennas Propag., vol. 5, Iss. 8, pp. 909-920 (2011).
E. Schaefer, et al., "Spacecraft Packaging"., Johns Hopkins APL Technical Digest, vol. 28, No. 1, p. 4-16 (2008).
S. Stille, et al., "Signal Integrity Challenges and Design Practices on Mobile Platforms", PCI Express, PCI-SIG. p. 1-43, 2008.
Muhammad Imran Nawaz, et al., "Substrate Integrated Waveguide (SIW) to Microstrip Transition at X-Band", Proceedings of the 2014 International Conference on Circuits, Systems and Control, p. 61-63 (2014).
K. Wu, et al., "The Substrate Integrated Circuits—A New Concept for High-Frequency Electronics and Optoelectronics", Mikrotalasna raja, Dec. 2003. p. 2-9.
L. D'Addario, et al., "Uplink Array Demonstration With Ground-Based Calibration", IPN Progress Report, 42-176, Feb. 15, 2009. p. 1-69.
S. Turner, "Concepts in Communication Amplifier Redundancy Systems", Paradise Datacom, Boalsburg, PA, 2004. p. 1-9 (2004).
Miteq. "Frequency Generation Products". Frequency Generation 2009. p. 1-82 (2009).
Luff Research."Phase-Locked Voltage Controlled Oscillator (PLVCO)". http://www.luffresearch.com/PLVCO.html, retrieved May 9, 2014.
Lucix Corporation. "Receivers and Up-or Down-Converters for Space Applications". http://www.lucix.com/index.php/converters-receivers (2012).
Thales Alenia Space. "Receiver-LNA-DOCON", Aug. 2012.

* cited by examiner

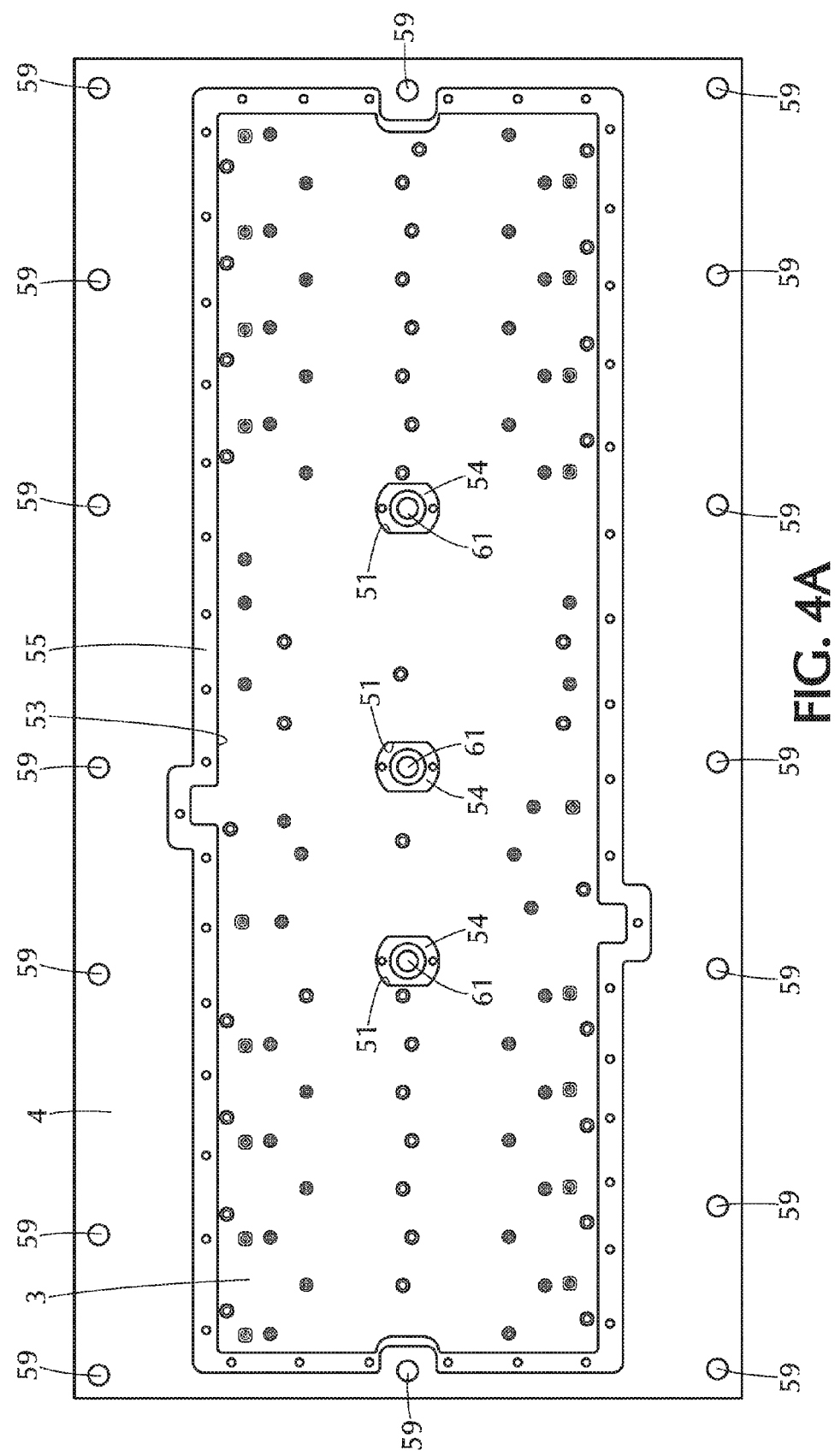

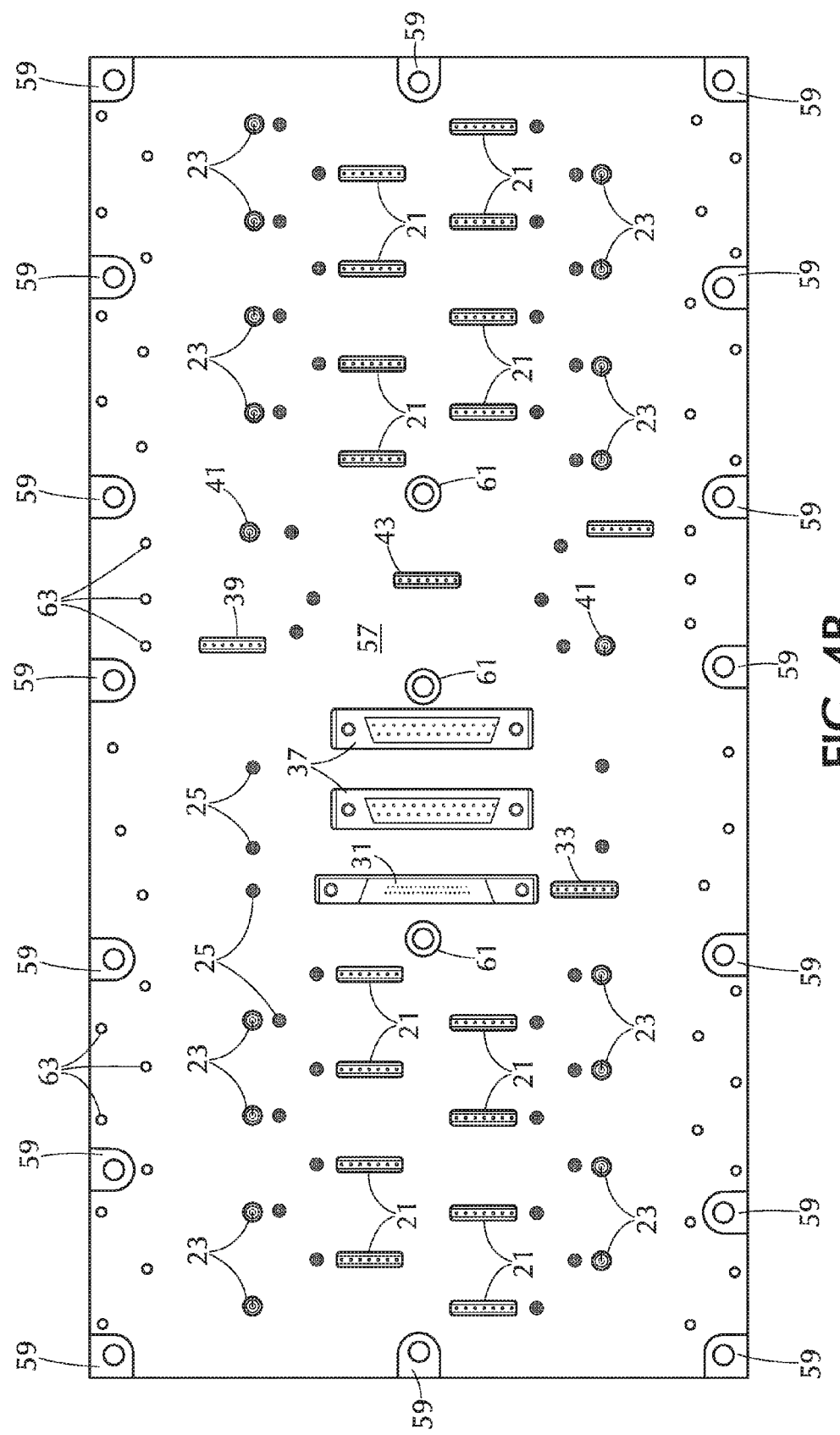

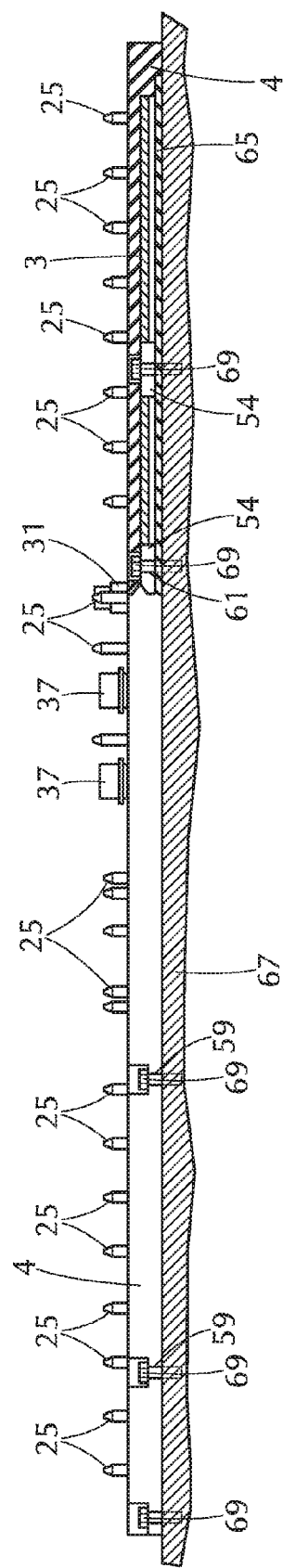

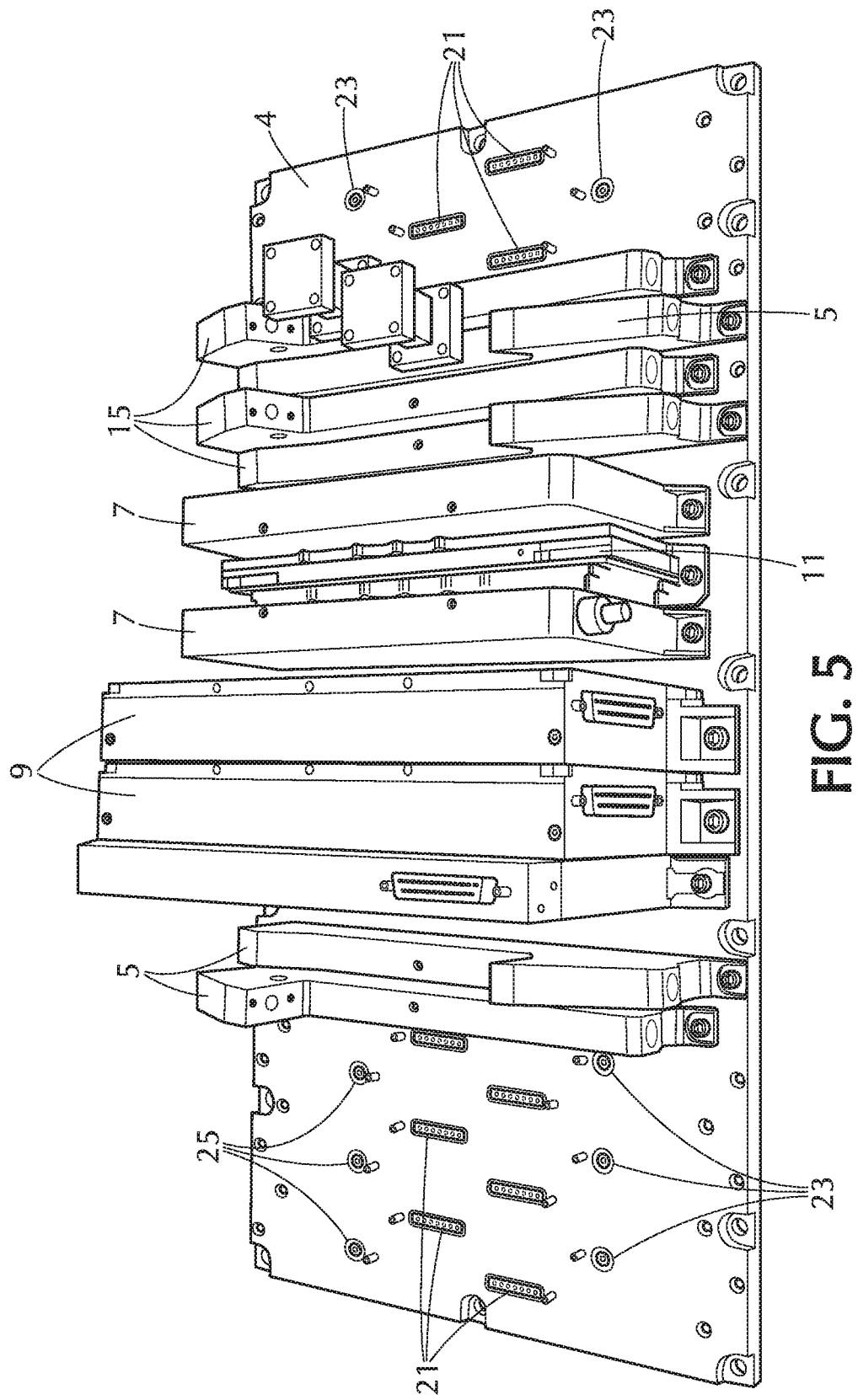

Power splitter Stackup - RF Section

| Layer | Name | Thickness | | Material | Section |
|---|---|---|---|---|---|
| Layer1 | Top Metal/MS | 0.7 | mil | .5 oz CU | RF Section |
|  | 4003C | 8 | mil |  | RF Section |
| Layer2 | MS/Stripline GND | 0.7 | mil | .5 oz CU | RF Section |
|  | Prepreg 4350B | 4 | mil |  | RF Section |
|  | 4003C | 12 | mil |  | RF Section |
|  | Prepreg 4350B | 4 | mil |  | RF Section |
| Layer3 | Strip line | 0.7 | mil | .5 oz CU, TICER | RF Section |
|  | 4003C | 20 | mil |  | RF Section |
| Layer4 | RF GND | 0.7 | mil | .5 oz CU | RF Section |
|  | Prepreg 4350B | 4 | mil |  | Bias and Control |
| Layer5 | Control lines 1 | 0.7 | mil | .5 oz CU | Bias and Control |
|  | 4003C | 8 | mil |  | Bias and Control |
| Layer6 | Control lines 2 | 0.7 | mil | .5 oz CU | Bias and Control |
|  | Prepreg 4350B | 4 | mil |  | Bias and Control |
| Layer7 | Control lines 3 | 0.7 | mil | .5 oz CU | Bias and Control |
|  | 4003C | 8 | mil |  | Bias and Control |
| Layer8 | DC GND | 0.7 | mil | .5 oz CU | Bias and Control |
|  |  | 77.6 | mil |  |  |

Copper
Dielectric

Vias
Layer1 to Layer3   Connect
Layer1 to Layer4   Thru
Layer4 to Layer8   Thru
Layer4 to Layer5   Connect
Layer5 to Layer6   Connect
Layer6 to Layer7   Connect
Layer5 to Layer8   Thru
Layer1 to Layer8   Thru Hole Mount

FIG. 6A

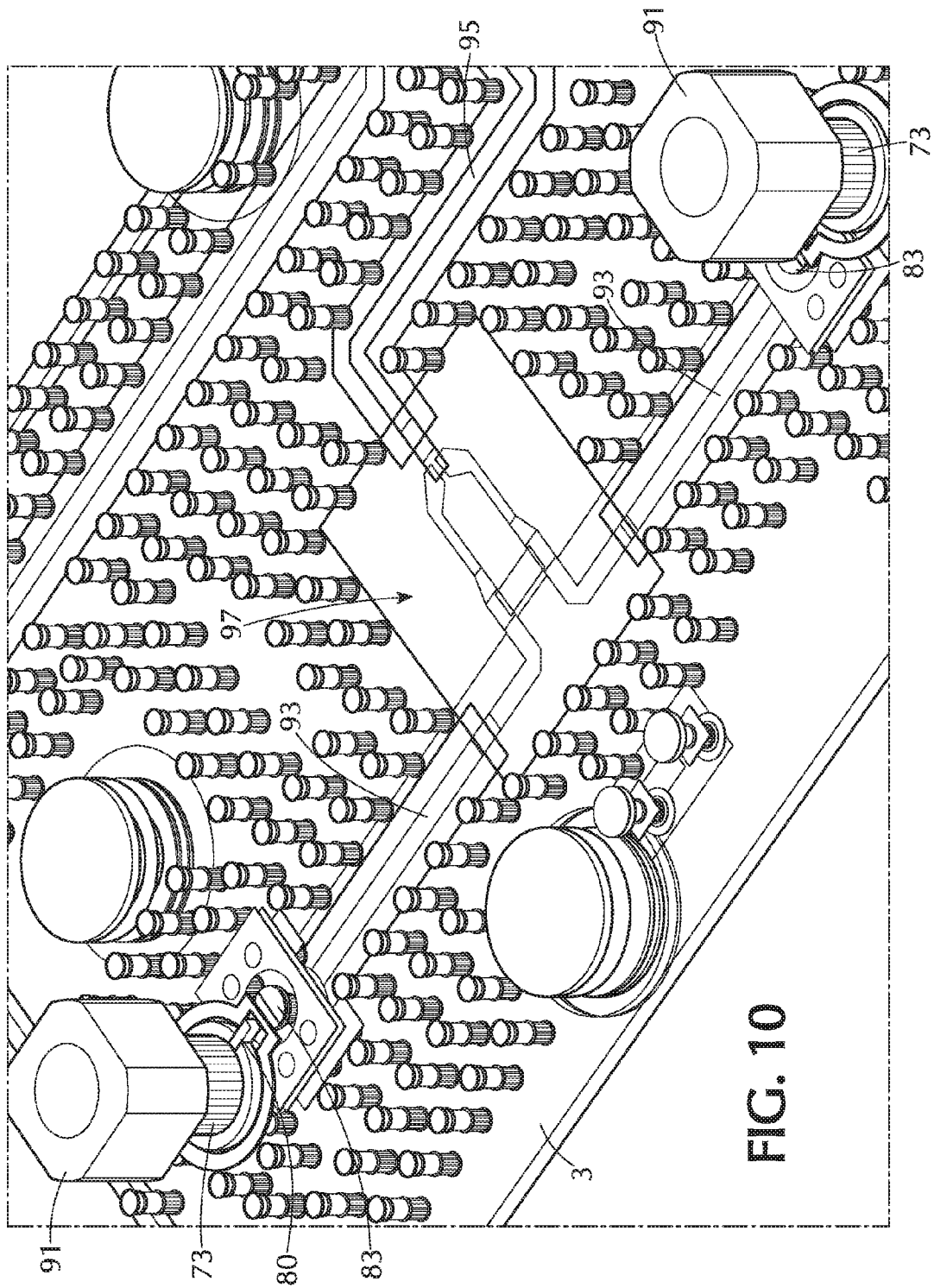

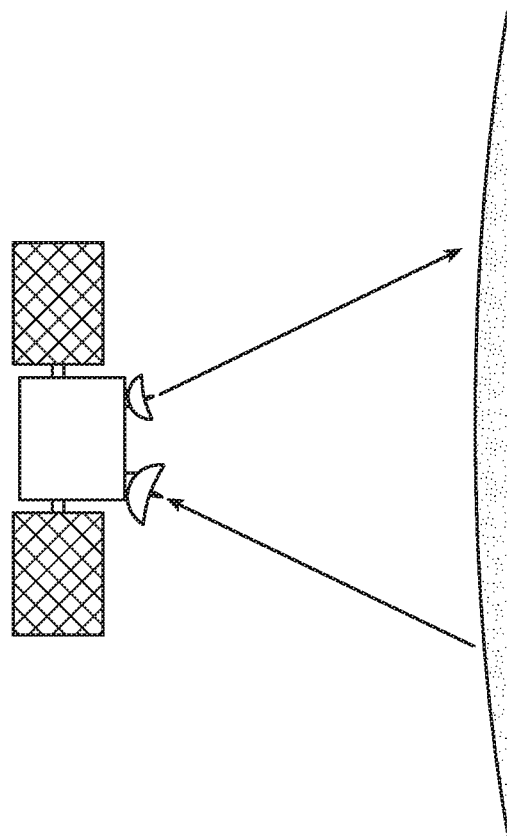

METHOD AND SYSTEM FOR SATELLITE USING MULTIFUNCTIONAL MOTHERBOARD

FIELD OF THE INVENTION

This invention relates to the general field of circuitry for use in satellites, and more particularly to systems for use in satellites supporting multiple frequency converters or other similar components.

BACKGROUND OF THE INVENTION

As is well known, satellites commonly are used to receive RF signals at one frequency that contain data (which would include TV signals, audio signals, and any other sort of data or information stream) from the earth, to then convert the RF signal received to a second RF signal of a different frequency containing the data, and to then transmit the second RF signal back to the earth.

The change of frequency is accomplished using mixers or frequency converters on the satellite that are configured to receive an RF signal at one predetermined frequency and combine it with a local oscillator (LO) signal at another frequency to output a second RF signal derived from it at a second different frequency. Each frequency converter of this type is commonly referred to as a slice, and a single satellite usually contains numerous slices providing for the simultaneous conversion of a number of incoming signals to a number of converted outgoing signals at different frequencies.

To operate, a frequency converter slice usually requires, at a minimum, connection to a power supply and to a source for a local oscillator (LO) signal of a given frequency. In the prior art, satellites with a number of converter slices have had, for each slice, its own respective LO signal source and a respective DC power supply or power conditioner. That means that a satellite with, e.g., sixteen frequency converters would have sixteen separate LO signal source components and sixteen DC power supplies. The number of power supplies and LO sources contributes to the weight of the satellite, which is highly undesirable, as even relatively slight additional weight of a satellite increases the cost of launch substantially.

In addition, driving signals common to all the receivers/frequency converters, i.e., the DC power and the LO signals, are fed to the receivers from external subassemblies that need to be mounted in proximity to the receiver assembly. Also, the control of the receivers, converters and transmission circuitry in the form of telemetry and telecommand signals is provided by independently interfacing the spacecraft's main bus with each receiver via a respective set of harness cables. The cables add to weight of the satellite, and the cable arrangement complicates assembly of the satellite from its components, which also adds to the cost of making and launching the satellite.

SUMMARY OF THE INVENTION

It is accordingly an object of the present invention to provide an arrangement for two or more mixers or frequency converters that avoids unnecessary weight in the satellite.

It is also an object of the invention to provide a system that allows for relatively simple and reliable assembly of the operational components of a satellite's electronic payload.

According to an aspect of the invention, a satellite is configured for use in space so as to receive RF signals, convert said RF signals to a different frequency range, and retransmit said converted RF signals. The satellite comprises a payload area supporting a motherboard structure having a motherboard. A plurality of frequency converters are each connected with an antenna system of the satellite so that each of the frequency converters receives a respective RF input signal. The frequency converters are each supported on the motherboard structure. A local oscillator source is supported on said motherboard structure and generates a local oscillator signal. The motherboard is configured to receive the local oscillator signal from the oscillator signal source and transmit it through the motherboard to each of the frequency converters. The frequency converters each are configured to convert the respective RF input signal to a respective RF output signal using the local oscillator signal and to transmit the RF output signal to the antenna system so as to be transmitted wirelessly.

According to another aspect of the invention, mass of the entire system of frequency converters is reduced by placement of the converters on a shared circuit board. All the units providing the functionalities of frequency conversion, DC power supply, LO signal generation, and telecommand and telemetry interfacing are integrated in a single mechanical package that can be installed in the satellite payload bay with minimal setup, and fewer electrical and mechanical connections are required both within the system and to the spacecraft than with prior art systems.

According to an aspect of the invention, the board supporting the components is an underlying multilayer motherboard on which a set constituting some or all of the satellite frequency converters are mounted. The set of the frequency converters on the motherboard are all provided with the LO signal needed from one LO signal source on the motherboard, and the power for all of the frequency converters of the set is provided from a single power supply or power conditioner on the motherboard. This reduces the number of LO sources and power supplies needed, and, as a consequence, weight of the satellite is reduced.

An additional redundant LO source and an additional redundant power supply may be provided in parallel to the frequency converters of the set to ensure uninterrupted operation of the satellite, which still provides a reduction in weight relative to the prior art systems with a power supply and a LO source for each converter.

In addition, the satellite command circuitry may also be connected with the motherboard, which connects it with the frequency converters of the set so as to control the satellite operation.

Other objects and advantages of the invention will become apparent from the specification herein, and the scope of the invention will be set out in the claims.

BRIEF DESCRIPTION OF THE DRAWINGS

FIG. 4A is a view of the underside of the motherboard of FIG. 3C where the motherboard is in a mounting frame or base plate that is to be secured to the wall of the satellite payload bay.

FIG. 4B is a view of the connections of the front of the motherboard of FIG. 4A extending through the mounting frame or base plate.

FIG. 4D is a partially cut-away front view of the motherboard installed in the satellite payload bay.

FIG. 5 is a perspective view of the partially assembled motherboard system with the base plate, with some of the frequency converters absent.

FIG. 6A is a diagram of the layers of a PCB multilayer system in a motherboard according to the invention.

FIG. 10 is a cut-away perspective detail view of the motherboard showing a strip line connecting two GPPO connectors with a signal splitter.

FIG. 14 is a diagram of an orbital communications satellite.

DETAILED DESCRIPTION

The present invention relates to an apparatus used in a satellite in which integrated frequency converters or low-noise amplifiers that share common resources, i.e., local oscillator and power supply units, are supported on a multilayer motherboard structure carrying multiple signals to the integrated set of frequency converters or low-noise amplifiers in a multipack architecture. Such a satellite is schematically illustrated in FIG. 14. Generally, the satellite in orbit receives wireless RF transmissions from the earth with a receiving antenna or antennae, converts them to a different frequency range, and retransmits the converted signals back to earth via a transmission antenna or antennae.

All functionalities of multipack, frequency conversion, DC conversion, local oscillation (LO) signal generation, and telecommand and telemetry interfacing are integrated in a single mechanical package. All the signals and power necessary to operate the receiver units in the integrated assembly are conveyed to the receivers via the underlying multilayer motherboard, resulting in i. superior integration of all the functionalities required to operate a panel of frequency converters into a single mechanical structure;
ii. mass and size optimization;
iii. DC power efficiency optimization; and
iv. a single point of contact between the telecommand, telemetry and control bus and all the receivers, allowing a massive reduction in the number of harnesses required to interface the multipack system with the spacecraft.

1. Overall Motherboard System

Figure 1:
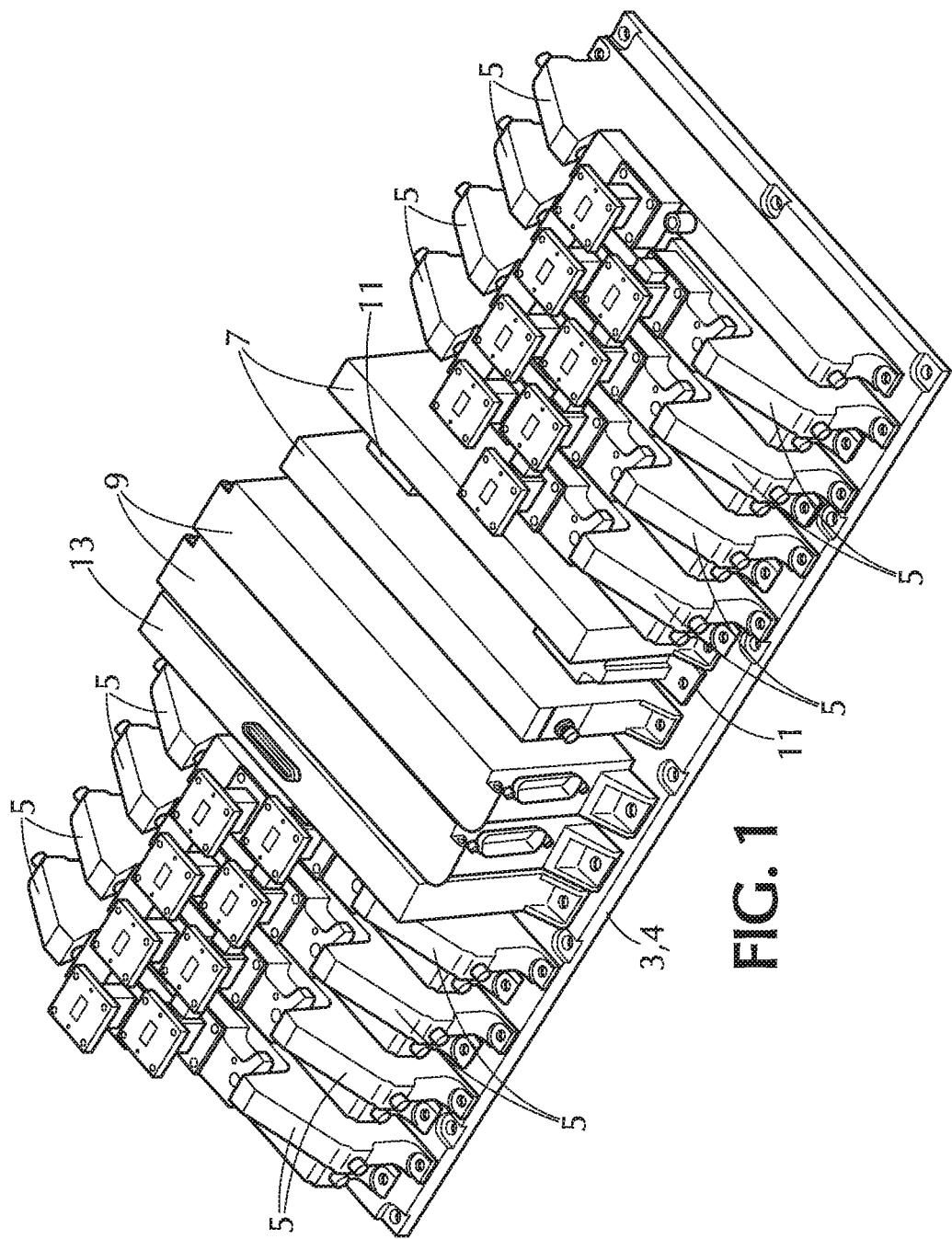
FIG. 1 is perspective view of a system according to the invention.

FIG. 1 is a perspective view of an embodiment of the invention. The frequency conversion system 1 is a compact, lightweight system for providing frequency conversion on several frequency bands, and is particularly designed for satellite applications. The bottom of the system is a base plate 4 that can be affixed to the payload bay in a satellite. The system 1 can be used to up-convert or down-convert a number of frequencies, including standard satellite frequencies such as the Ka band, 26.5 to 40 GHz.

The frequency conversion system 1 has sixteen (16) radio frequency DNCs, or slices 5, that each performs a respective frequency conversion. It also has mutually-redundant additional components in the form of a dual serial interface and control assembly 13, dual electronic power conditioners (EPC) 9, and dual phase-locked voltage controlled oscillators (PLVCO) 7 with dual temperature-compensated crystal oscillators (TCXO) 11.

Each slice is seated or mounted on a motherboard, which is itself secured to an aluminum base plate 4 that is in turn secured to the bulkhead of the payload bay.

2. The RF Converter Units

Figure 2:
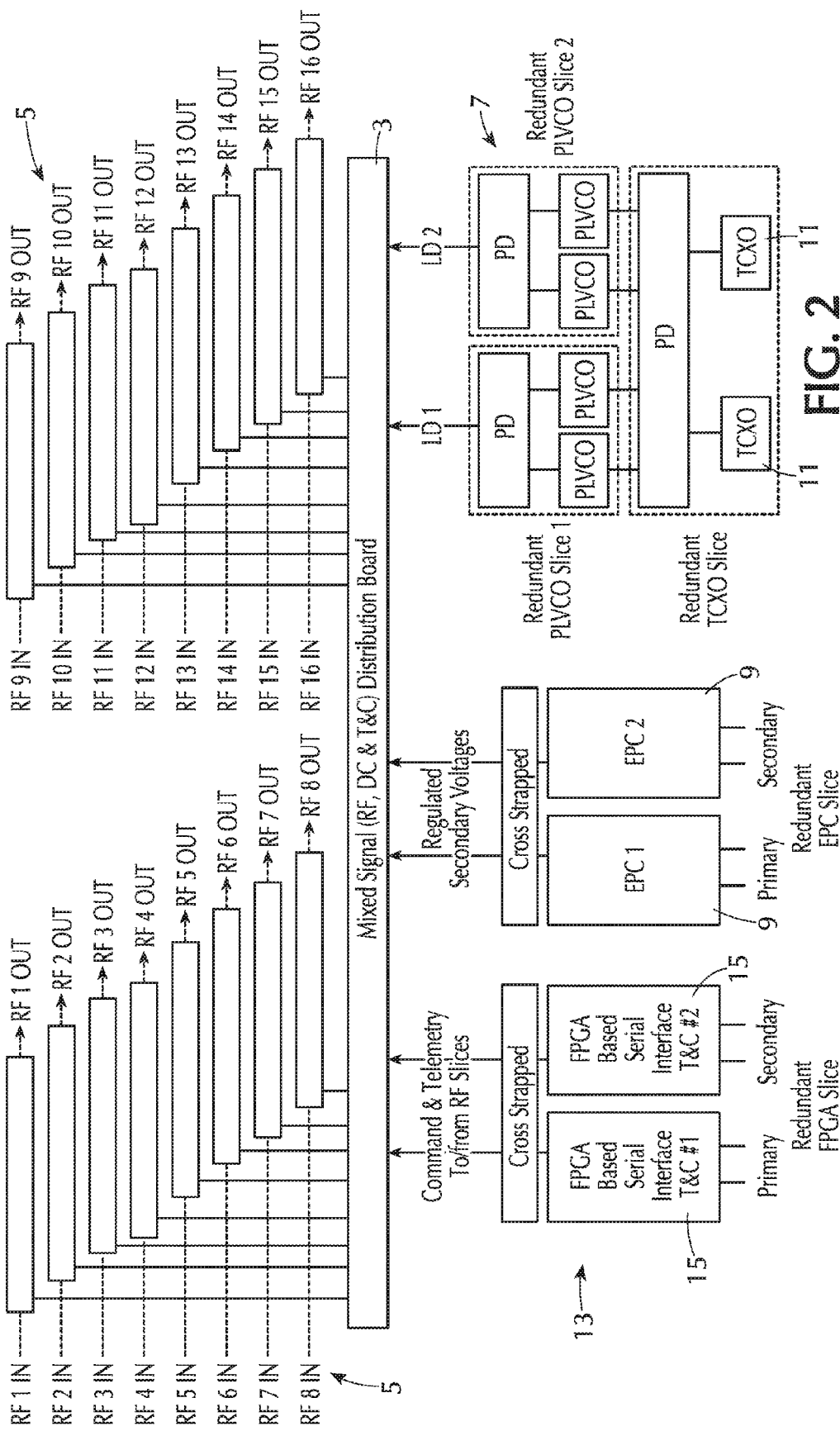
FIG. 2 is a block diagram of the general connections of the system of FIG. 1 with the motherboard of the system.

Referring to FIG. 2, the sixteen DNC slices 5 are mounted on and electrically connected with motherboard 3. Each slice 5 receives a respective incoming radio frequency (RF) signal, RF 1 IN to RF 16 IN, containing data, e.g., audio or video content, at one frequency from an antenna on the satellite via a connecting waveguide conductor that is plugged into the slice, and outputs a respective converted RF signal, RF 1 OUT to RF 16 OUT, containing that data at a second frequency via a coaxial connection output. The output RF signal is then filtered, amplified and transmitted to an antenna system to be broadcast back to Earth. The DNC components that may be used for the frequency conversion should be capable of down-converting incoming signals up to at least 35 GHz or higher, and of outputting RF signals in a lower but similar frequency range, e.g., 100 MHz to 25 GHz.

3. The LO Signal Sources

The DNC slices 5 also each receive a local oscillator (LO) signal through the motherboard, and that LO signal is used to perform the frequency conversion.

The LO signal sources for the frequency converter slices 5 are two mutually-redundant phase-locked voltage controlled oscillators (PLVCO) slices 7 also mounted on and electrically connected with the motherboard 3. The two redundant PLVCO units 7 each are mounted on the motherboard 3 and each contains a redundant set of two internal PLVCO circuits. At any given time, one of the two redundant PLVCO circuits in each of the PLVCO slices 5 operates to produce at least one LO signal that is transmitted to a power divider 8 in the motherboard 3. The other PLVCO circuit in each of the PLVCO slices 5 is inactive and present as a backup. The LO-signal output of one PLVCO slice 7 flows to a splitter circuit that splits it into eight LO signals applied to eight of the RF DNC slices 5, and the LO-signal output of the other PLVCO slice 7 flows to another splitter circuit that divides that LO signal into eight signals and transmits them to the other eight RF DNC slices 5. The two splitter circuitries that split the LO signal output into eight different LO signals for each PLVCO slice 7 are essentially identical, and comprise a series arrangement of Wilkinson power dividers on the motherboard that split the first output into two signals, then split each of those to yield four signals, and then split each of those to yield eight signals. In this way, an LO signal is provided to all of the DNC slices 5 through the motherboard 3 from one PLVCO circuit of each PLVCO slice 7.

In the event of the failure of the operating PLVCO circuitry in a PLVCO slice, the other PLVCO in the PLVCO slice 7 can take over the function of generating the LO signal for that PLVCO slice, and the satellite operations can continue despite the loss of the one PLVCO unit 7.

Within one PLVCO unit 7 the two constituent PLVCOs operate redundantly, i.e., one PLVCO operates to produce an LO signal for eight of the RF DNC slices 5, with the other as a redundant back-up system. The two PLVCO slices may be configured to both generate LO signals of the same frequency to be distributed to all the RF slices. Alternatively, the two PLVCO slices may be configured to produce LO signals of different frequencies, i.e., with one PLVCO slice 5 sending a first LO signal at a first frequency to one group of eight RF DNC slices 5, and the other PLVCO slice 5 sending a second LO signal at a second frequency to the rest of the RF DNC slices 5.

The PLVCO slice units may be any units appropriate to produce the desired LO signal, which in the preferred embodiment is a signal in the range of about 1 GHz to 15 GHz, and at a power level high enough that, after being divided among the relevant RF slices, the LO signal still has enough power to be used by the RF DNC slice in the down-conversion process.

The PLVCOs produce the reliable LO signal based in part on their connection with a single TCXO unit 11 that contains two redundant temperature-compensated crystal oscillators (TCXOs), one of which acts as a reference oscillator that phase locks the PLVCOs. The other TCXO in the TCXO unit is redundant, and takes over as the reference oscillator if the first TCXO fails.

The TCXOs are micro modules that are assembled inside the larger housing assembly that becomes the TCXO slice assembly 11. The TCXOs are supported in the TCXO unit 11, which is an aluminum housed unit separate from the PLVCO slices 7, and which is mounted and plugged independently into the motherboard 3. The precise connection of the TCXO units 11 to the PLVCO slices 7 is not seen in FIG. 2, but the motherboard provides the signal distribution to PLVCO slices, and it connects the TCXO output to power dividers that split the TCXO output signal to provide it to the operative PLVCOs in the PLVCO slices. The motherboard also provides DC power and command/telemetry signal routing.

Alternatively, the TCXOs may each be in an independent housing and be provided with its own discrete multi-pin connection to the motherboard.

The TCXOs of the TCXO unit 11 are crystal-based oscillators producing a signal approximately 50 MHz, and in the preferred embodiment, the TCXO micro-modules are purchased from the Q-Tech Corporation.

4. Telemetry and Control Subcomponent

A centralized unit for telemetry and command signals is provided by dual redundant serial interface and control assembly 13, which is made up of two FGPA-based serial interfaces, only one of which is active, allowing the other to serve as a back-up. The operative interface 15 is mounted on and connected to the motherboard 3 as well, and is also electrically linked to an on-board satellite data bus that connects with the satellite's on-board computer controls and other circuitry that controls satellite operation and allows for command and control of the satellite from an operator on Earth. The connection to the bus allows the motherboard to communicate via the bus, receiving through it telemetry and command signals directed to the RF DNC slices 5, and also sending command and telemetry data back from the RF DNC slices 5 modify operation of the motherboard and its attached components.

5. Motherboard Power Supply

The RF slices 5, the PLVCOs 7, the TCXOs 11 and the control assembly 13 all operate on DC power that is transmitted to them through the motherboard 3 from redundant Electronic Power Conditioners (EPC) 9. The EPC system 9 comprises two power conditioning units, one actively operating and the other a redundant backup, that are mounted on the motherboard 3 and connected to it electrically. A raw power source for the satellite, e.g., batteries, solar panels, or some other power source, is connected with the EPCs, and transmits a raw DC current that is usually around 30 to 100 volt DC. The operative EPC unit 9 conditions that power so as to produce a DC current at one or more voltages for supplying power to the components supported on the motherboard 3, which has conductors that carry the conditioned DC current to each of the component slices 5, 7, 9 and 11 on the motherboard 3. The EPC of the preferred embodiment filters the raw DC power to remove spikes, spurious voltages, and other irregularities, and produces DC current at +15 volts, +5 volts, and −5 volts, at a power level up to about 100 watts.

6. Motherboard Design

Referring to FIGS. 3A to 3E, the motherboard 3 is a multilayer circuit board with circuitry therein, and a number of sockets for installation of the various components described above that are mounted thereon. Because it is a relatively high-frequency signal, e.g., on the order of 10 GHz or more, the LO signals are distributed over the motherboard by micro strip lines, and the connections to the strip lines in the board carrying the LO signal are by push-connection coaxial GPPO® connectors.

The motherboard 3 has sixteen DNC slice sockets 21 each a seven-pin socket configured to receive a cooperative portion of a respective RF DNC slice therein to electrically connect the slice to the motherboard circuitry. The motherboard also has sixteen GPPO sockets 23 connecting with strip lines therein carrying the LO signal thereto to which a complementary connector on a respective RF DNC slice is to be plugged during installation.

Alignment pins 25 aid in aligning each of the RF DNC slices with the respective sockets 21 and 23 into which it complementarily plugs. A total of twenty-seven alignment pins 25 are mounted to the motherboard each by a respective 2-56 screw.

Figure 3A:
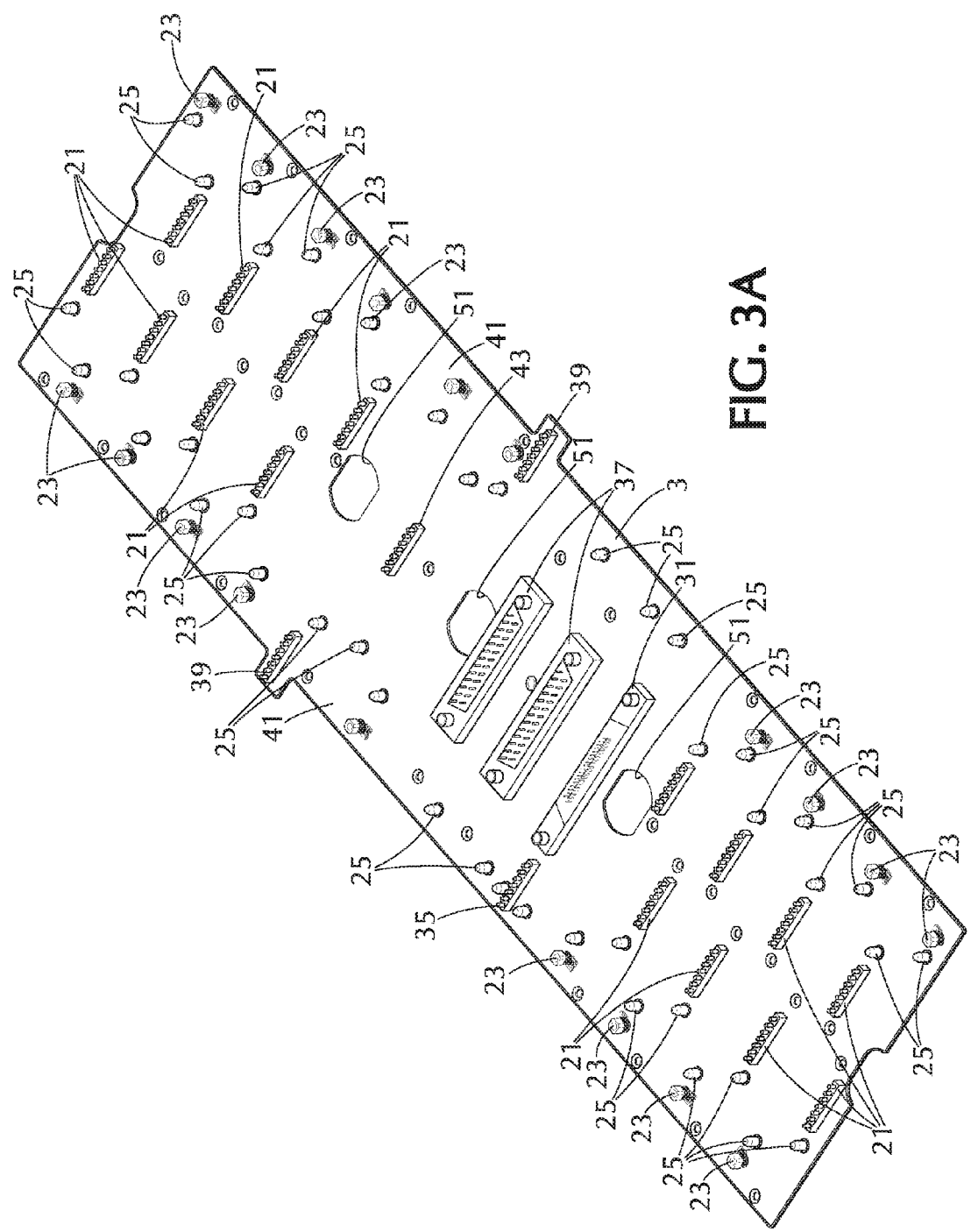
FIG. 3A is a perspective view of a motherboard according to the invention.
Figure 3B:
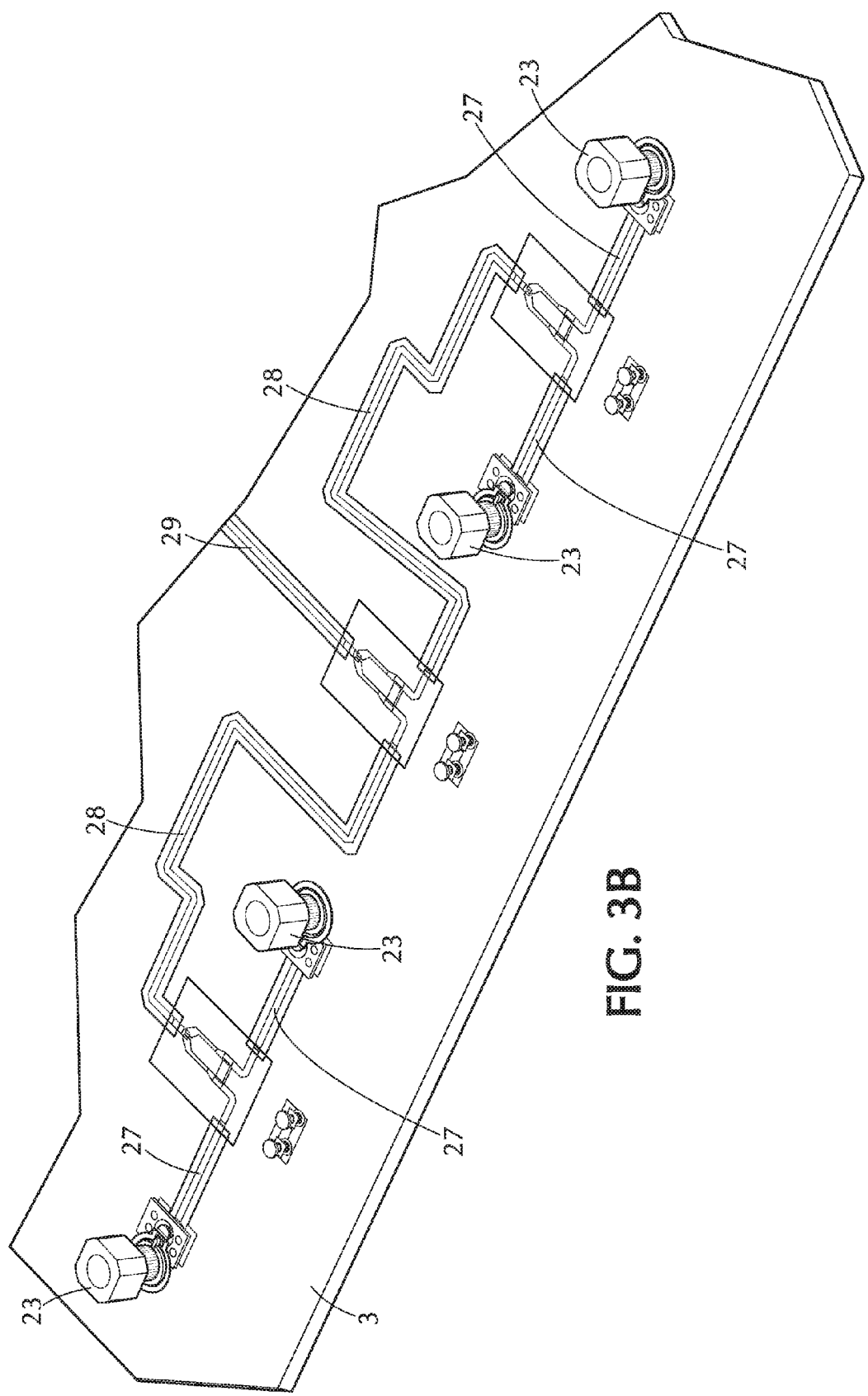
FIG. 3B is detailed cut-away perspective view of a portion of the motherboard of FIG. 3A.
Figure 3C:
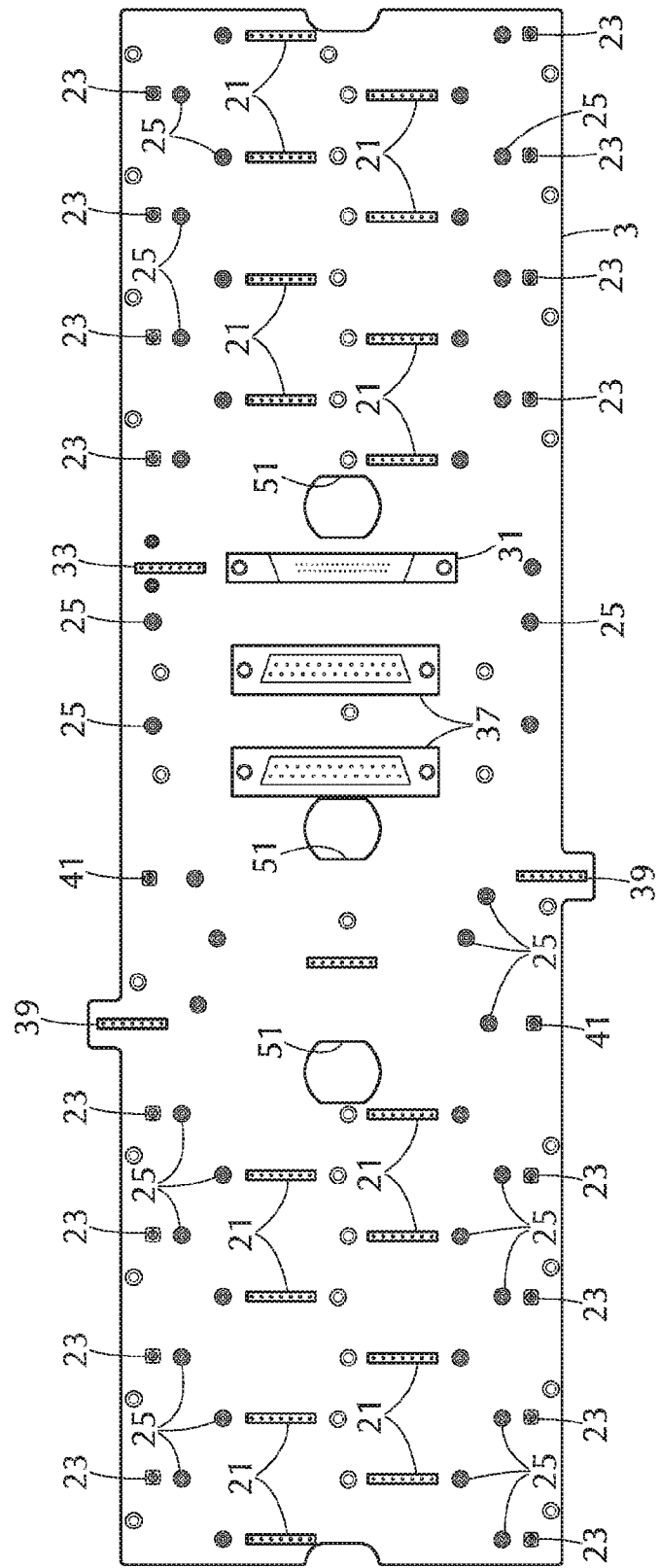
FIG. 3C is a plan view of a motherboard according to the invention.
Figure 3D:
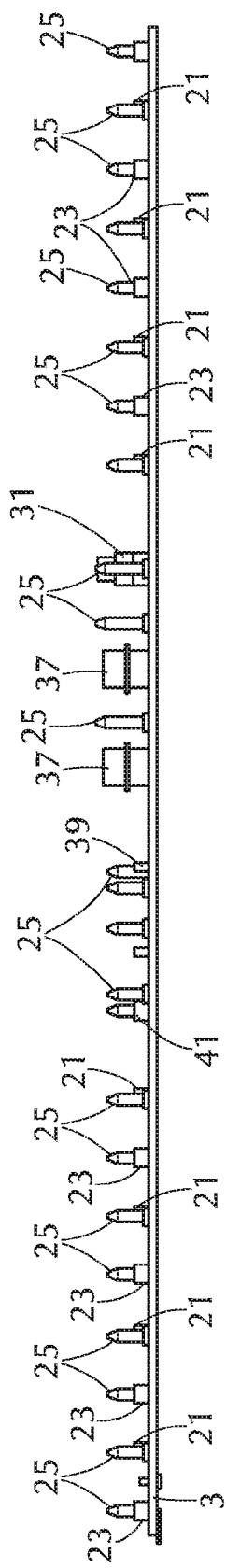
FIG. 3D is a front view of the motherboard of FIG. 3D.
Figure 3E:
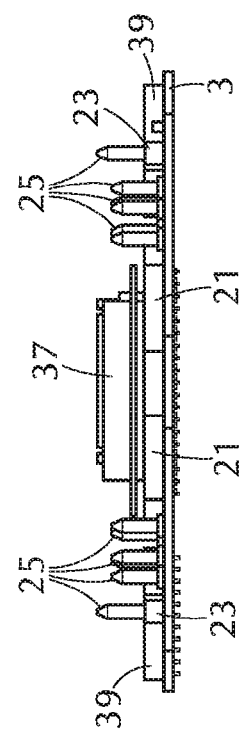
FIG. 3E is a side view of the motherboard of FIG. 3D.

FIG. 3B shows in detail the connection of four GPPO sockets 23 along one side of the motherboard 3. From each socket 23, a respective thin-film copper-layer strip line 27 connects electrically to a Wilkinson power divider structure leading to thin-film copper-layer strip lines 28. Those two strip lines 28 lead to another power divider that links to strip line 29. The LO signal is supplied to strip line 29 and is split into two LO signals each in a respective one of strip lines 28. Those LO signals are each split into two more LO signals, each of which is supplied to the respective GPPO sockets 25.

This four-socket splitter structure is replicated four times in the motherboard 3 to accommodate eight frequency converters. See also FIG. 7C.

Multi-pin socket 31 is a thirty-seven-pin D-sub connector and second multi-pin contact structure 33 is a seven-pin inline connector configured to conformingly receive a multi-pin contact structure on the command and control unit 13 containing field programmable gate array (FPGA)-based serial interfaces T&C #1 and T&C #2, aided by guide pin 35. When the unit 13 is plugged into these sockets 31 and 33, it is connected through the motherboard to communicate with the RF slices 5, and the other components on the motherboard.

The two DC/DC power converter modules 9 connect to the PCB via multi-pin connectors 37, which here are 25 pin D-sub connectors. The motherboard has 18 surface mount GPPO connectors 23 and 41 for the connection of the LO signal from the two PLVCO's to the board, and connecting the distributed LO signals from the motherboard to the RF slices 5. Wilkinson power dividers provide for LO signal distribution on the motherboard 13.

EPC units 9 plug into multi-pin connectors 37. PLVCOs plug partly into multi-pin connectors 39, and also plug into GPPO connectors 41, and supply the LO signal through those GPPO connectors 41. The unit 11 containing the two TCXOs together attaches to a multi-pin, preferably seven-pin, connector 43.

Circuitry in the layers of the multilayer motherboard 3 connects the various connectors, as will be described below. The outer surface of the motherboard is covered with gold, which is protective and prevents migration of impurities or contaminants into or out of the materials of the motherboard.

7. Housing and Installation of Motherboard

Referring to FIG. 4A, base plate 4 is formed from a ⅜ inch think planar aluminum metal stock. Base plate 4 has a recess 53 therein that precisely receives therein the motherboard 3 in a snug fit. The motherboard is secured in this place by thirty-seven 2-56 screws secured and extending through mounting openings or apertures along the longitudinal edges and generally along the longitudinal centerline of the motherboard 3.

Motherboard 3 also has apertures 51 therein that receive therein support members 54 that fit the apertures to high tolerance. The support members 54 have central bore therein that allows a bolt to extend therethrough.

Figure 4C:
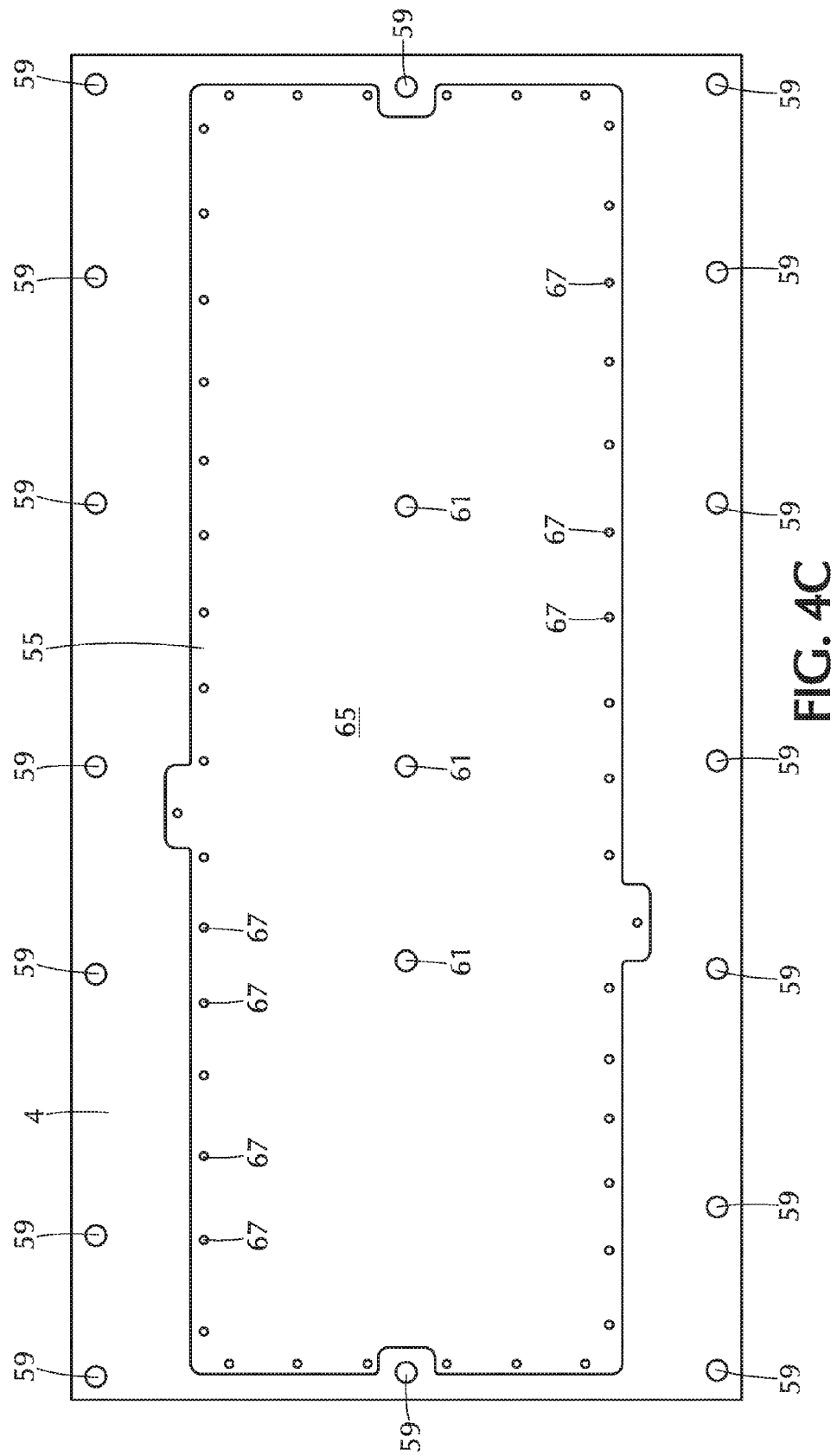
FIG. 4C is a view as in FIG. 4A, but with the cover plate secured over the motherboard.

As best seen in FIG. 4C, when so placed, the back of the motherboard 3 is then covered by a thin aluminum cover plate 65 configured to fit over the motherboard in shallow recess 55. Shallow recess 55 in the base plate 4 extends around the motherboard recess 53, and has a number of threaded bores therein. The cover plate 65 is placed in the recess 55 and then bolted over the motherboard by securing it by screws 67 threaded into threaded bores in recess 55. The resulting combined structure of base plate 4 and the cover plate forms a sort of housing that provides support and protection for the motherboard 3.

Referring to FIG. 4B, which shows the other side of the base plate 4, and 4D, which shows a cross-section, it may be seen that in the recess 53 base plate 4 has a number of bores or apertures that accommodate the upwardly projecting connectors structures and pins 25 of the motherboard so that they can extend therethrough, resulting in a planar face 57 of base plate 4 over which the components of the system may be installed. Apertures are also provided for sockets 21, 23, 31, 33, 37, 39 and 41, and also for all the alignment pins 25, all of which project from the motherboard. Shielding is provided internal to the base plate 4 by use of gasket material around each RF and DC connector.

Referring to FIGS. 4B and 4D, base plate 4 also has sixteen sunken recesses with bores 59 therein through which the base plate 4 is bolted to the payload bay 67, which has an appropriate planar surface with bores for such an installation. In addition, base plate 4 has bores 61 that align with the bores of support members 54, and bolts 69 are inserted through bores 61 and bolted to the satellite payload bay 67 as well. When mounted through the base plate 4, these bolts 69 extend through the support members 54, which support the middle of the motherboard against transverse loads, which can be substantial during launch of the satellite, and possibly at other times in its operative lifetime. The bolts 69 are supported in the base plate 4 and cover plate 65. The support members 54 are also of a thickness that they maintain the total thickness of the recessed base plate 4 plus the support member thickness at ⅜ inch, which preserves the planarity of the flat front surface 57 of the base plate 4.

The various operating components of the multifunction motherboard system when on the base plate 4 may be mounted either before or after bolting to the payload bay 67 of the satellite body. A number of threaded bores 63 are provided in the base plate 4 facing away from the wall of the payload bay, and the various components mounted on the motherboard are additionally secured by being connected by screws entrained in these bores 63, which are positioned to co-act with the relevant component to be mounted in each area of the motherboard structure.

FIG. 5 shows a partially assembled motherboard system with some of the components already installed over the base plate mounting surface 57. Specifically, the dual command unit 13 (with an upward facing multi-pin socket for linking to bus), the two EPCs 9, the two PLVCO units 7, and the dual TCXO unit 11 are all shown mounted on the back plate 4 and connected to the motherboard electrically. Four RF DNC slices 5 are mounted on one side of the motherboard, and two on the other side, leaving available sockets 21 and 23 for six more RF slices 5 on the left and four more on the right. All the components are bolted in place onto base plate 4.

When fully assembled in the satellite, the system of the assembly with the motherboard 3 performs numerous functions for operation of the frequency conversion system 1, including, but not limited to, the following:

1) Routing the local oscillator (LO) signals from phase locked voltage controlled oscillators (PLVCO) to the corresponding DNC/RCVR slice;
2) Routing the reference signal from the dual temperature-compensated crystal oscillators (TCXO) module to each phase locked voltage controlled oscillator;
3) Routing the various voltages from the DC to DC power modules to the Field-Programmable Gate Arrays (FPGA), TCXO's, PLVCO's, and each DNC/RCVR slice;
4) Routing the FPGA ON/OFF commands to each DNC/RCVR slice;
5) Routing the FPGA Gain Control voltages to each DNC/RCVR;
6) Routing the FPGA ON/OFF select commands for the TCXO's and each PLVCO;
7) Maintaining sufficient electromagnetic interference (EMI)/radio frequency (RF) shielding; and
8) Maintaining sufficient rigidity to support and align all plug-in modules.

The base plate 4 also acts as a heat sink absorbing heat from the motherboard and its components and allowing the heat to dissipate into the wall of the payload bay 67 to which it is bolted. The payload bay 67 may have cooling systems that absorb heat generated by the motherboard.

Figure 7A:
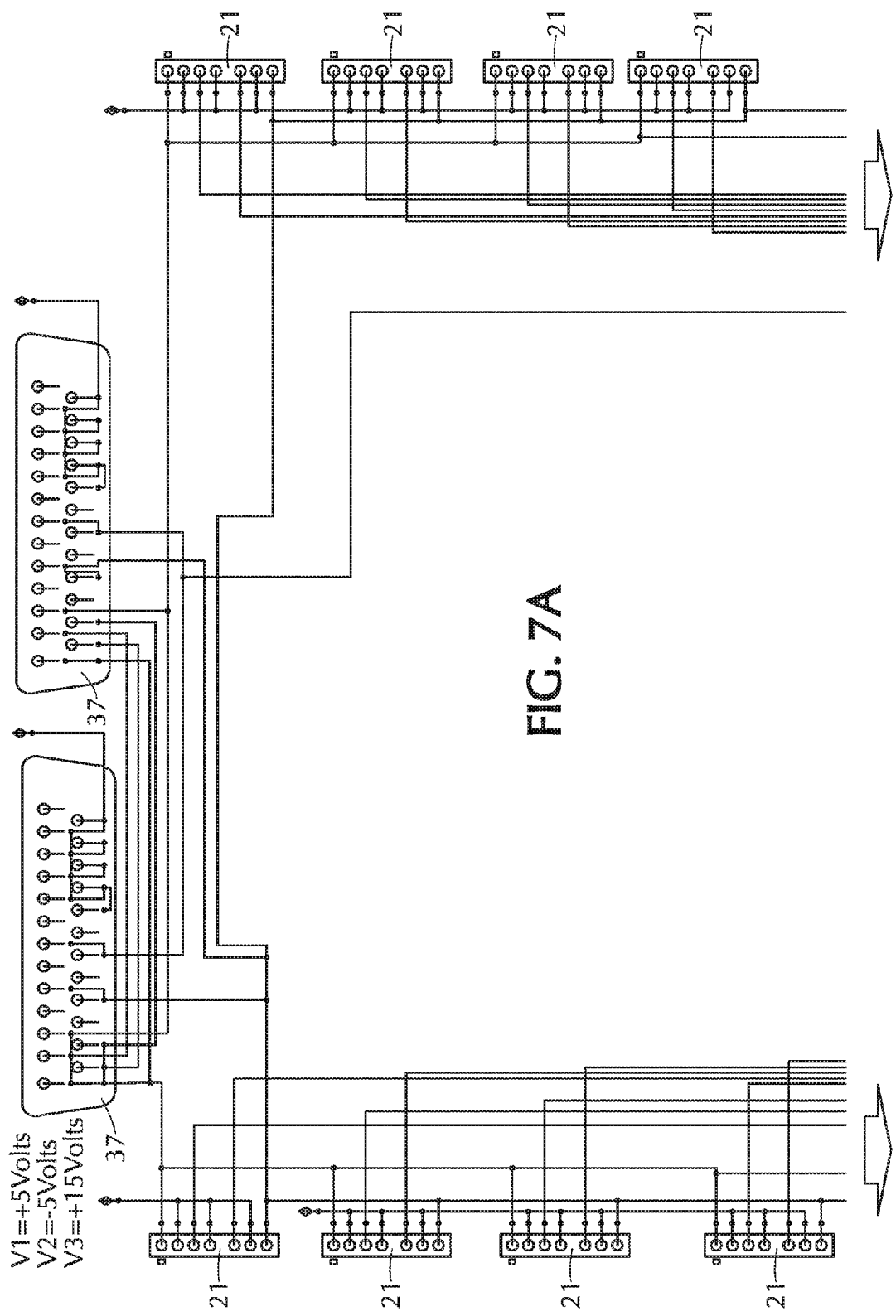
FIG. 7A is an upper half of a diagram of a schematic of the circuitry in the motherboard connecting the various components connecting the various components from their multi-pin connectors.
Figure 7B:
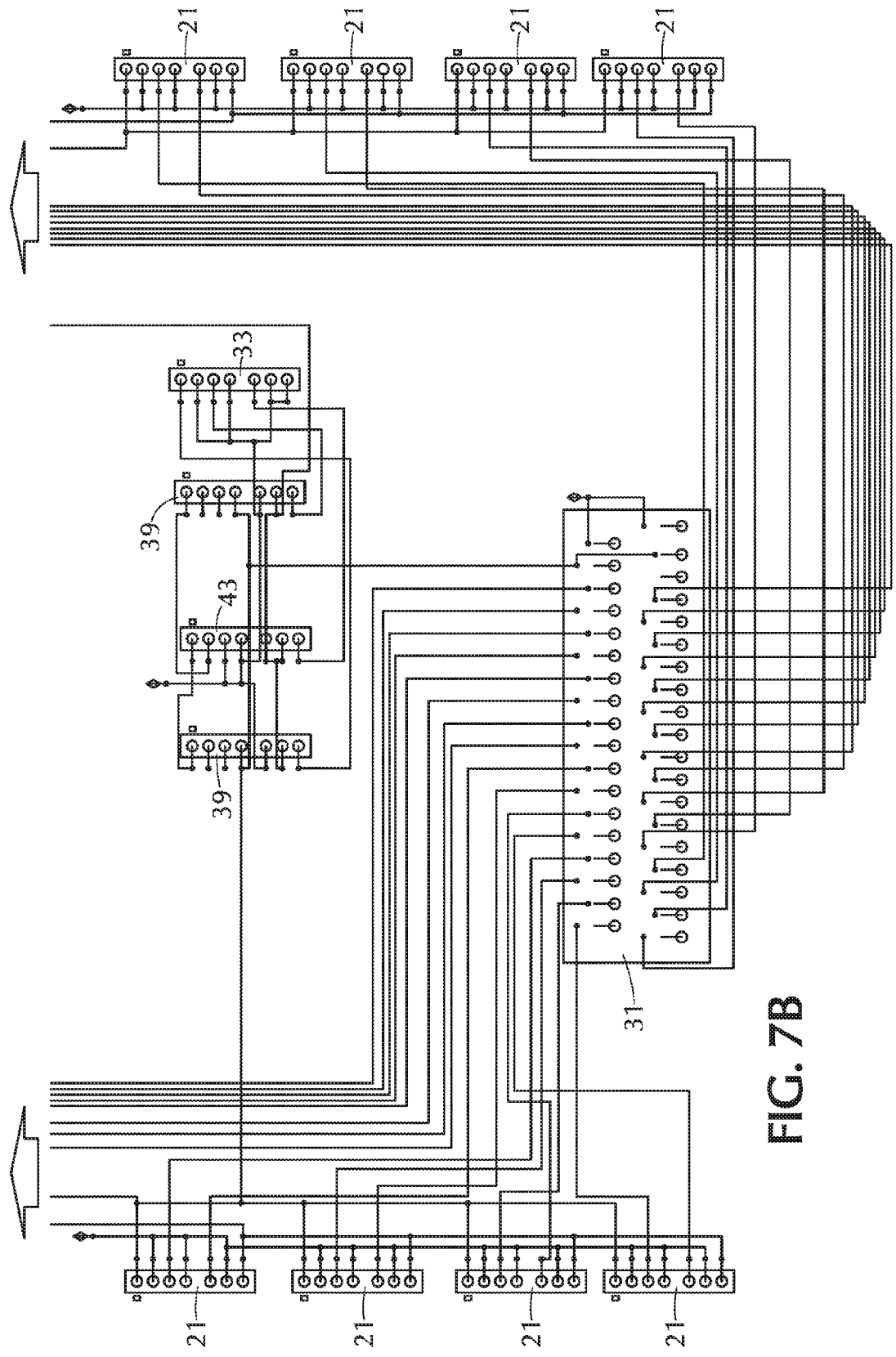
FIG. 7B is the lower half of the diagram of FIG. 7A, with the aligning lines connecting between the figures, as indicated by the arrows.
Figure 7C:
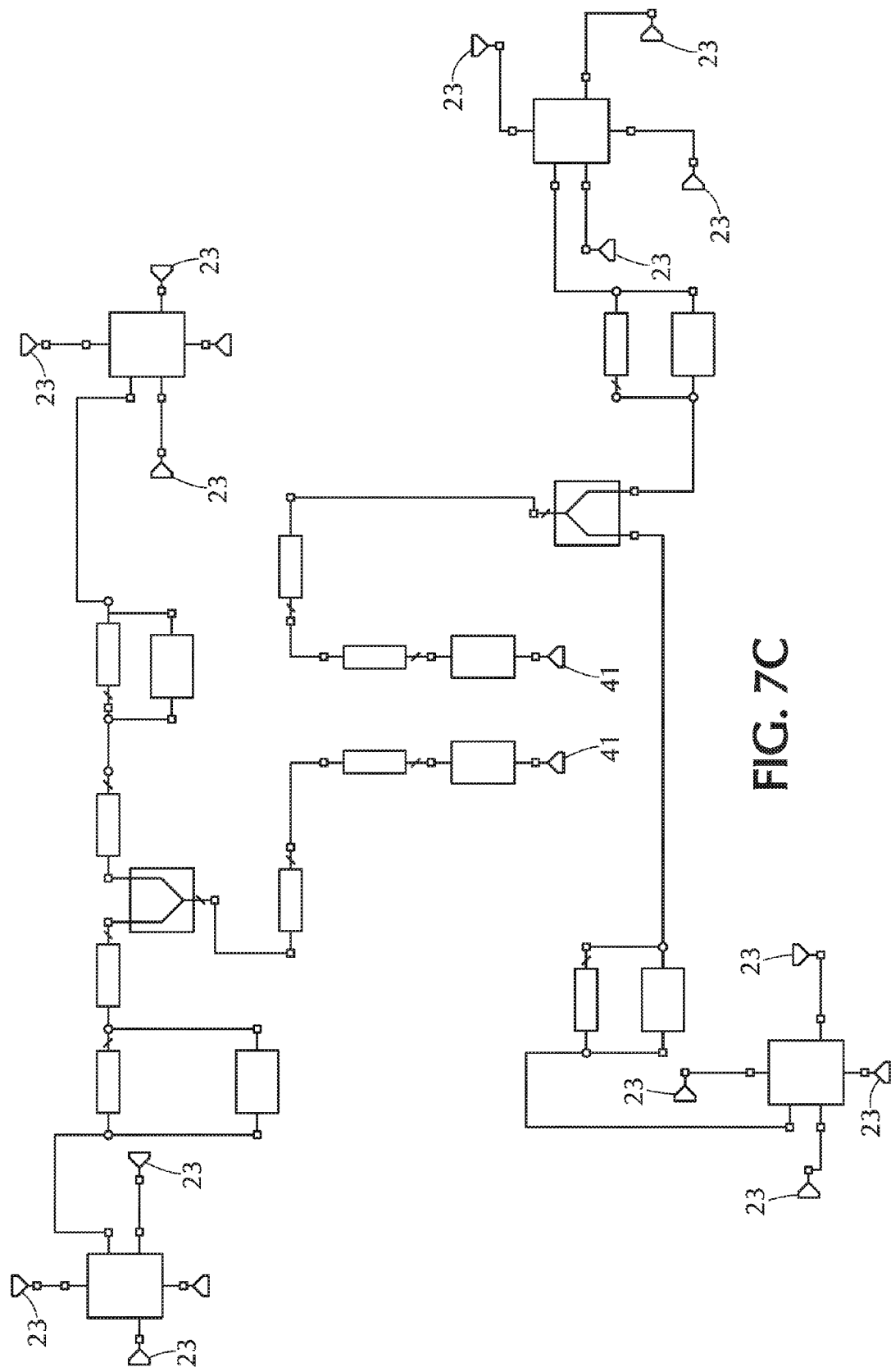
FIG. 7C is a schematic of the connections from the LO signal sources to the RF signal down-converters in a motherboard of the invention.

A schematic of the connections between the components in the motherboard 3 is seen in FIGS. 7A, 7B and 7C. FIGS. 7A and 7B constitute a single schematic diagram of the system, and the two figures show circuits that connect where aligned with the large arrows on the bottom of FIG. 7A and the top of FIG. 7B. The motherboard is designed to ensure that the phase of signals is properly calibrated throughout the system. This includes calibration of electrical path lengths and management of impedances throughout the circuit. In particular, the use of strip lines with controlled characteristic impedance are used to minimize impedance mismatches that can result in phase shifts in signals propagating through the system. As best seen in FIG. 7C, the strip lines carrying the LO signal to the sockets 23 include functional elements labeled STRACE that allow for the setting or calibration of the specific length of the conductive path carrying the high-frequency LO signals.

8. Motherboard Multilayer Configuration

Figure 6B:
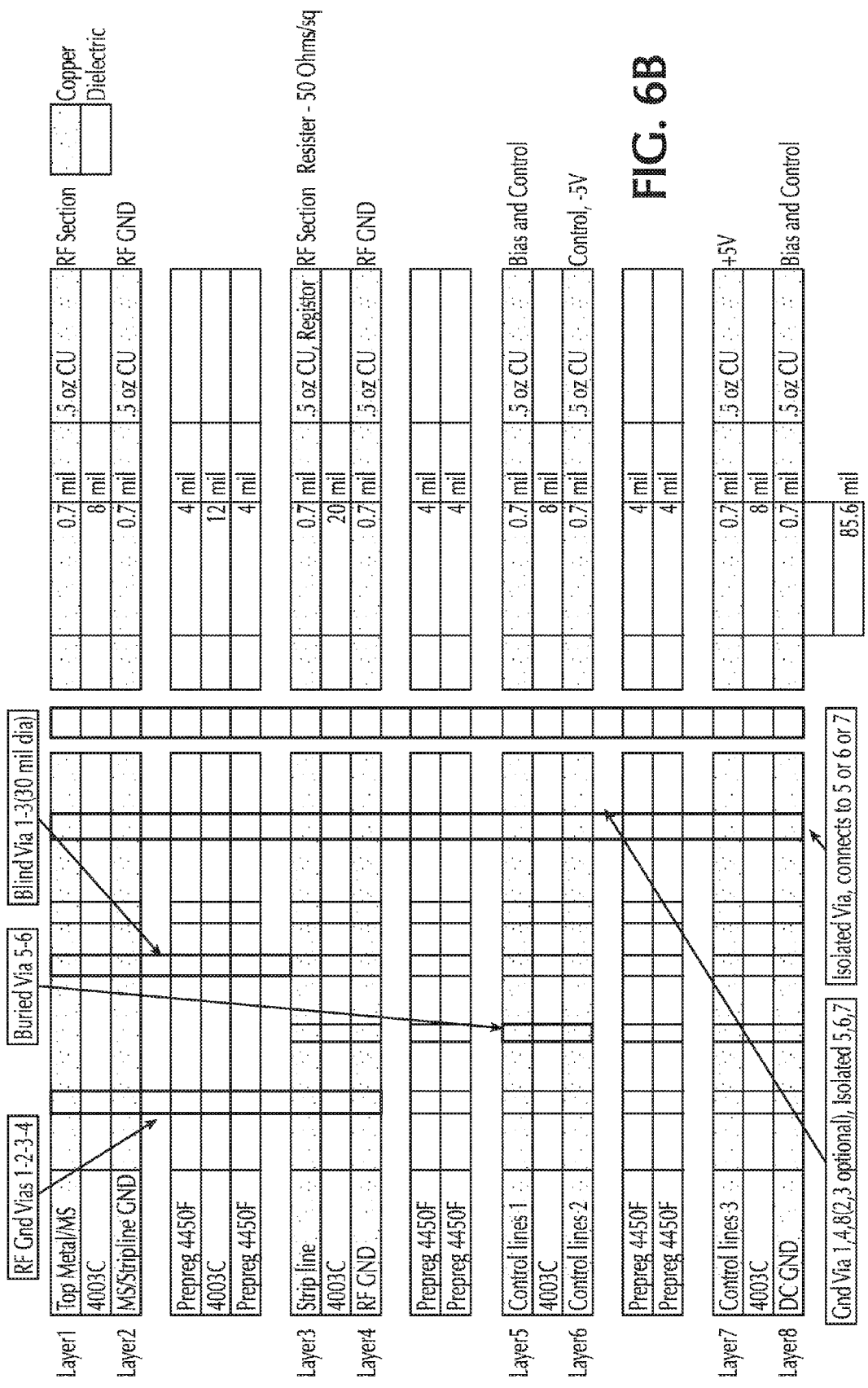
FIG. 6B is a diagram of the layers of an alternate embodiment of a PCB multilayer system in a motherboard according to the invention.

Referring to FIGS. 6A and 6B, the motherboard has a multilayer printed circuit board (PCB) with eight (8) metal layers, preferably each of a copper film with a thickness of approximately 0.7 mil, that is etched as is commonly known in the art to produce circuits. Dielectric material suitable for a space operation is applied between metal layers. The dielectric material is preferably Rogers 4003C, Rogers Prepreg 4350B and/or Rogers Prepreg 4450F. FIGS. 6A and 6B show slightly different embodiments, the main distinction being the use of Prepreg 4350B in the embodiment of FIG. 6A, and the use of added layers of Prepreg 4450F in the embodiment of FIG. 6B, resulting in a slightly thicker PCB (85.6 mil as compared to 77.6 mil).

Different layers carry different electrical signals, and the interlying ground layers ensure proper isolation of the different signals to avoid cross interference.

a. The RF Section

Metal layers 1 to 4 make up the RF section of the motherboard PCB. Connections to and from this section of the motherboard are by coaxial to strip line connectors, preferably GPPO connectors, to carry high-frequency LO or RF signals being transmitted without degradation.

The RF section comprises a top layer 1 of copper film, followed by a. 8 mil layer of 4003C, followed by layer 2 of copper connected to ground. The top layer 1 is the upper ground shield, and also it is a microstrip transmission line layer for connection to the surface mounted GPPO connectors. Layer 2 is the microstrip ground, and also the top layer for the strip line power splitter structure of layer 3. Sequential layers of 4 mil thick prepreg 4350B, 12 mil thick 4003C, and 4 mil thick prepreg 4350B underlie the ground layer 2 and overlie metal layer 3.

Instead of being of simple copper film, metal layer 3 is formed using thin film resistor-conductor material available from the company Ticer Technologies of Chandler, Ariz., whose website is www.ticertechnologies.com, or from Ohmega Technologies, Inc. of Culver City, Calif., whose website is www.ohmega.com. This material may be used by methods well-known to those of skill in the art, to make circuits with printed isolation resistors and other conductor pattern that can carry high frequency RF signals. It has a resistance of 50 Ohms/sq. The conductor and/or resistor pattern of layer 3 makes up the strip lines that receive the LO signal from the PLVCOs over the motherboard and divide the LO signals for distribution to the RF slices, and can also receive and carry any other RF signals that might be transmitted to or from the RF slices via the motherboard.

The strip-line layer 3 is on top of a 20 mil layer of 4003C, which in turn overlies layer 4. Layer 4 is ground as well, and serves as the bottom ground line for the strip line structure of layer 3. It also acts as a top shield ground for the DC, bias and control circuitry of the lower layers of the motherboard.

Ground fence of 20 mil diameter connect layers 1 to 4 for RF isolation. The loss associated with inserting the LO signal into the strip line through the GPPO connector is less than 15 dB, and the loss match is +/−1 dB. The port return loss is less than 10 dB.

As has been mentioned above, the LO signals from the PLVCOs are divided into eight signals from the two PLVCOs of each unit using Wilkinson power dividers in the strip line layer 3, an example of which is seen in the detail of FIG. 3A. Each LO signal output of the PLVCOs is divided into two by a divider, and then each of those is divided into two by two more dividers, then each of those is divided into two by four more dividers, resulting in 16 separate LO signals, each being transmitted through the strip line circuit of layer 3 to a respective one of the RF DNC slices 5 on the motherboard, and used to down-convert the respective incoming RF signal.

The strip line circuitry of the connections of the RF section of the motherboard between the GPPO connectors of the PLVCOs and the GPPO connectors of the RF DNC slices is shown in FIG. 7C.

b. The Control and Power Section

Layer 5 is a 0.7 mil copper layer, and is separated from the ground of layer 4 by a 4 mil layer of prepreg 4350B material or by two 4 mil layers of prepreg 4450F. An 8 mil layer of 4003C lies under layer 5, and under that material is metal layer 6, also of 0.7 mil copper.

Layers 5 and 6 are the control line routing layers of the motherboard and form a circuit linking the serial interface and control assembly 13 to the RF DNC slices 5, with vias between layer 5 and layer 6 to allow connections where necessary (see FIG. 6B). Connections to this portion of the motherboard are by multi-pin connectors. The commands from unit 13 go to the RF slices through these levels. There is also some −5V DC power supplied through layer 6 to those components that require it. The schematic of FIGS. 7A and 7B shows the connections between the various motherboard connectors that are provided by the circuitry of layers 5 and 6.

A 4 mil layer of prepreg 4350B material or two 4 mil layers of prepreg 4450F separate layer 6 from layer 7, which contains the power planes. Layer 7 carries the power, 5V DC current, to the RF slices, the PLVCOs, the TCXOs and to the control assembly 13. Signals from the control assembly to those components are through layers 5 and 6.

Layer 8 is the bottom ground layer, and solder connection layer for all of the feed through connectors, i.e., the multi-pin connectors that are secured on the top of the motherboard 3 have pins that extend through the motherboard and are soldered to layer 8. It is isolated from layer 7 above it by an intervening 8 mil layer of 4003C dielectric material.

9. Connection to RF Layer of Motherboard

Figure 8:
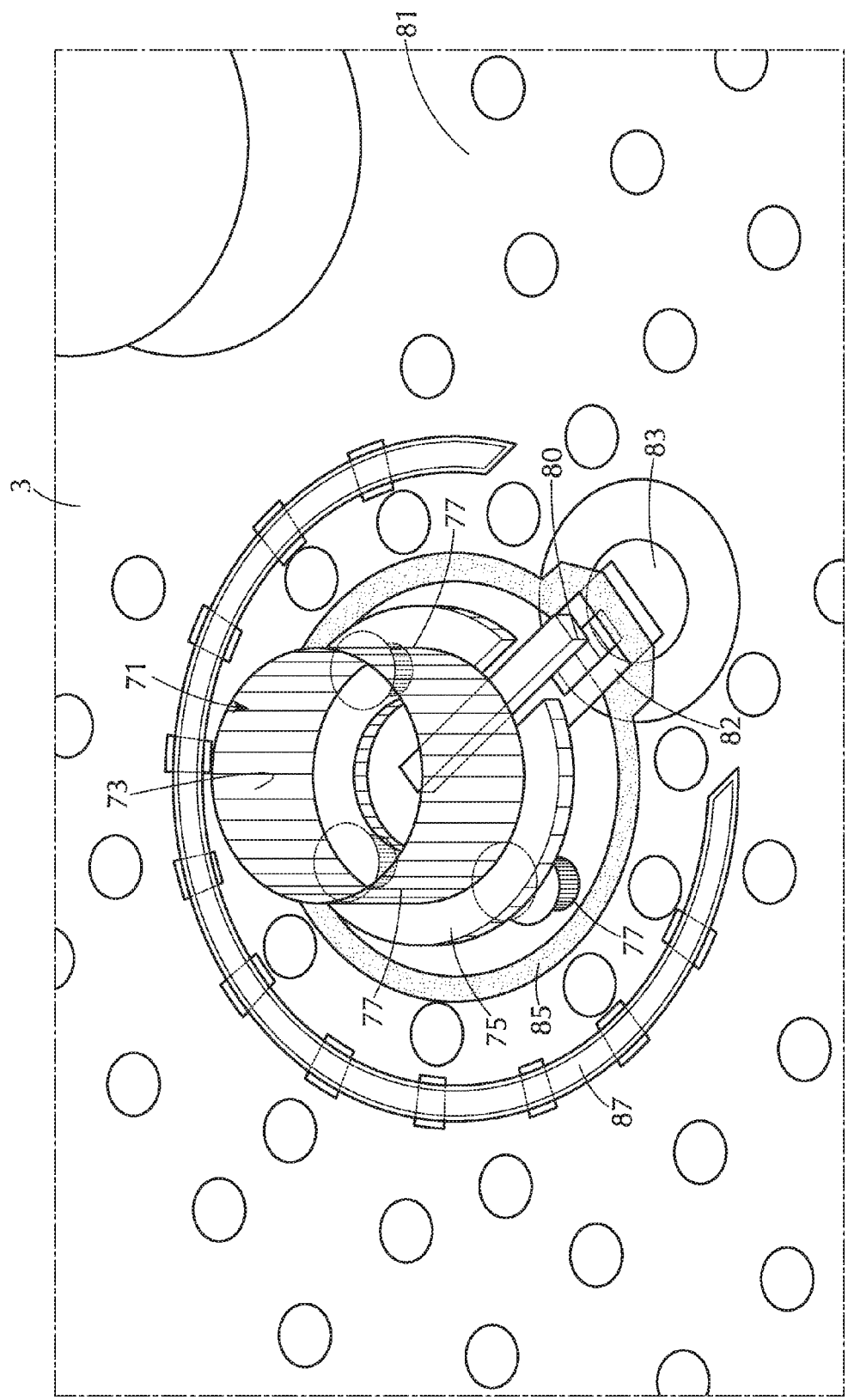
FIG. 8 is a perspective detail view of a GPPO connector on the motherboard.

FIG. 8 shows a perspective view of a GPPO connector 71 on the motherboard. The GPPO connector 71 efficiently delivers radio-frequency LO signals to the motherboard 3 and from the motherboard to the various connected subunits. The connector 71 allows the use of a coaxial cable connection on one side and a strip line connection on the other while minimizing any impedance mismatch that would lead to phase shifts or power loss in the LO signal.

Figure 9:
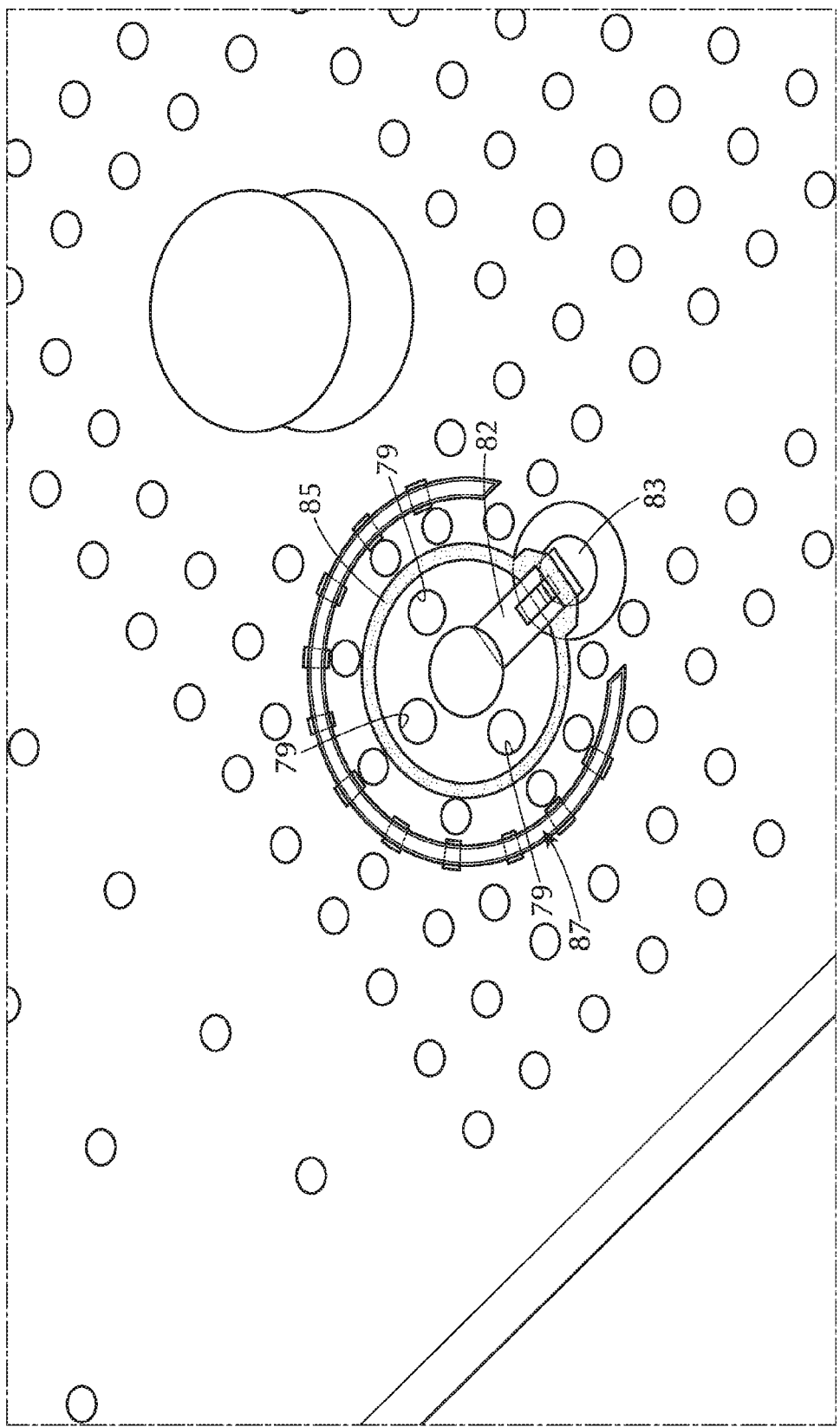
FIG. 9 a perspective detail view of the structure of the motherboard at the site of a GPPO connector without the GPPO connector.

Referring to FIGS. 8 and 9, the GPPO connector has a cylindrical body on a disc-shaped base 75 with three downwardly extending pins 77 that fit into corresponding holes 79 in the upper surface 81 of motherboard 3. When so assembled, the GPPO center pin 80 contacts the beginning of a conductor 82 leading to the strip line through a circular conductor in via 83 leading down to the layer of the strip line film (layer 3 in FIG. 6A). Solder mask 85 and thermal relief structure 87 are provided to avoid damage to the motherboard when the connector 71 is soldered into place.

Referring to FIG. 10, which shows the motherboard 3 with the upper layers of the motherboard PCB removed for visibility, the connectors include additional housing 91 that fits over the cylinder and completes the GPPO connector 71. The conductor in via 83 connects to the strip line 93 in layer 3 (FIG. 6A). LO signals may be supplied to the strip lines 93 by providing an LO signal in strip line 95 that is split by divider 97 so as to flow into strip lines 93, up through the vias 83 to the center pin 80 of the GPPO connector, and into the circuitry of the unit that has a complementary plug inserted into the GPPO fixture.

A similar structure is used in the GPPO connections of the PLVCOs to the motherboard, i.e., sockets 41 of FIGS. 3A to 3E.

Figure 13:
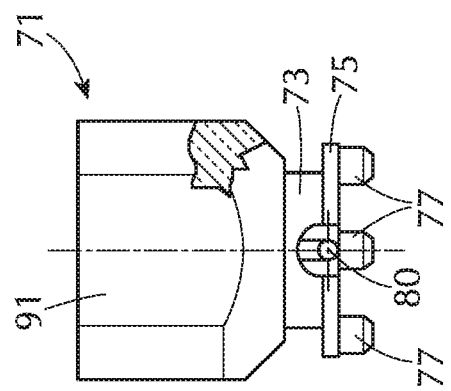
FIG. 13 is a front view of the connector of FIGS. 11 and 12.
Figure 12:
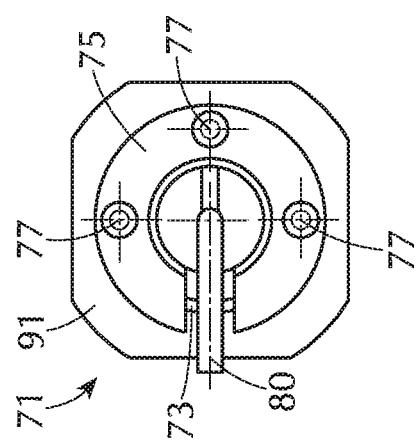
FIG. 12 is a bottom view of the connector of FIG. 11.
Figure 11:
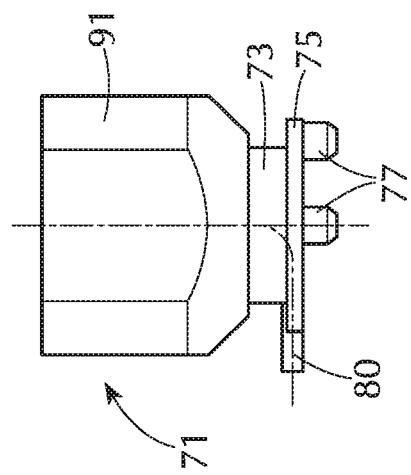
FIG. 11 is a side view of a GPPS connector used with the motherboard.

FIGS. 11 to 13 show the assembled parts of the GPPO interface connector from the side, the bottom and the front of the connector.

The terms herein should be read as terms of description rather than of limitation, as those with this disclosure before them will be able to make changes and modifications therein without departing from the spirit of the invention.

What is claimed is:

1. A satellite configured for use in space so as to receive RF signals, convert said RF signals to a different frequency range, and re-transmit said converted RF signals, said satellite comprising:
    a payload area supporting a motherboard structure including a motherboard;
    a plurality of frequency converters each connected with an antenna system of the satellite so that each of the frequency converters receives a respective RF input signal, said frequency converters each being supported on said motherboard structure;
    a local oscillator source supported on said motherboard structure and generating a local oscillator LO signal;
    the motherboard configured to receive the local oscillator signal from the local oscillator signal source and transmit said local oscillator LO signal through the motherboard to each of the frequency converters;
    said frequency converters each configured to convert the respective RF input signal to a respective RF output signal using said local oscillator signal and to transmit the RF output signal to the antenna system so as to be transmitted wirelessly;
    wherein the motherboard includes strip lines connected so as to carry the LO signal from the LO signal source to each of the frequency converters; and
    wherein the motherboard has a layered structure, and the strip lines are supported in said layered structure with a strip line conductor in a layer of the layered structure, and the motherboard has a protective metallic layer and a ground layer above and below the layer of the strip line conductor and separated therefrom by intermediate layers.

2. The invention according to claim 1, wherein the strip lines are connected with the frequency converters by coaxial push connection sockets supported on the motherboard.

3. A satellite configured for use in space so as to receive RF signals, convert said RF signals to a different frequency range, and re-transmit said converted RF signals, said satellite comprising:
    a payload area supporting a motherboard structure including a motherboard;
    a plurality of frequency converters each connected with an antenna system of the satellite so that each of the frequency converters receives a respective RF input signal, said frequency converters each being supported on said motherboard structure;
    a local oscillator source supported on said motherboard structure and generating a local oscillator LO signal;
    the motherboard configured to receive the local oscillator signal from the local oscillator signal source and transmit said local oscillator LO signal through the motherboard to each of the frequency converters;
    said frequency converters each configured to convert the respective RF input signal to a respective RF output signal using said local oscillator signal and to transmit the RF output signal to the antenna system so as to be transmitted wirelessly; and
    wherein the plurality of frequency converters comprises eight frequency converters, and the motherboard has splitter circuitry therein that includes a first splitter that splits the LO signal into two initial LO signals, and then two subsequent splitters receiving and splitting each of the two initial LO signals into two subsequent LO signals, and then four final splitters that each receives a respective subsequent LO signal and splits it into two transmitted LO signals, resulting in eight transmitted LO signals, each of said transmitted LO signals being carried by the motherboard to a respective one of the frequency converters.

4. The invention according to claim 1, and further comprising a power supply system configured to supply power used by the frequency converters, said power supply system being supported on the motherboard and being electrically connected thereto so as to supply the power thereto, the motherboard being configured to carry the electrical power to the frequency converters.

5. The invention according to claim 4, wherein the motherboard carries the electrical power to the frequency converters through at an additional layer or a plurality of additional layers of conductive material in the layered structure that is isolated from and shielded from the layer carrying the LO signal.

6. The invention according to claim 5, wherein the satellite has additional circuitry that transmits to said motherboard electrical signals operable as commands that cause one or more of the frequency converters to alter operation thereof, said electrical signals being received by the motherboard and carried to a relevant frequency converter through said at least one additional layer or plurality of additional layers.

7. The invention according to claim 6, wherein the circuitry includes command and telemetry slices mounted on and connected electrically with the motherboard.

8. The invention according to claim 4, wherein the power supply system also provides power for the LO signal source, and the motherboard receives and carries the power for the LO signal source thereto through said at least one additional layer or plurality of additional layers.

9. The invention according to claim 4, wherein the power supply includes a power conditioner receiving electrical power from power systems of the satellite, said power conditioner being supported on the motherboard and modifying the electrical power so as to transmit to the motherboard an electrical current having a voltage that can be received and used by the frequency converters.

10. The invention according to claim 4, and further comprising a second power supply system wired in parallel with the first power supply system, said second power supply system being configured to supply power used by the frequency converters through the motherboard in the event of failure of the first power supply.

11. A satellite configured for use in space so as to receive RF signals, convert said RF signals to a different frequency range, and re-transmit said converted RF signals, said satellite comprising:
 a payload area supporting a motherboard structure including a motherboard;
 a plurality of frequency converters each connected with an antenna system of the satellite so that each of the frequency converters receives a respective RF input signal, said frequency converters each being supported on said motherboard structure;
 a local oscillator source supported on said motherboard structure and generating a local oscillator LO signal;
 the motherboard configured to receive the local oscillator signal from the local oscillator signal source and transmit said local oscillator LO signal through the motherboard to each of the frequency converters;
 said frequency converters each configured to convert the respective RF input signal to a respective RF output signal using said local oscillator signal and to transmit the RF output signal to the antenna system so as to be transmitted wirelessly; and
 wherein the RF input signal has a frequency in a range from about 26.5 GHz to about 40 GHz, the LO signal has a frequency in a range from 1 GHz to 15 GHz, and the RF output signal has a frequency of about 100 MHz to 25 GHz.

12. The invention according to claim 11, and further comprising a second plurality of frequency converters and a second LO signal source supported on the motherboard structure, the motherboard carrying a second LO signal from the second LO signal source to the second plurality of frequency converters so as to be used in converting input RF signals transmitted to said second plurality of frequency converters into output RF signals in a different frequency range.

13. The invention according to claim 12, wherein a power supply supported on the motherboard structure supplies power through the motherboard to the first and second plurality of frequency converters.

14. A satellite configured for use in space so as to receive RF signals, convert said RF signals to a different frequency range, and re-transmit said converted RF signals, said satellite comprising:
 a payload area supporting a motherboard structure including a motherboard;
 a plurality of frequency converters each connected with an antenna system of the satellite so that each of the frequency converters receives a respective RF input signal, said frequency converters each being supported on said motherboard structure;
 a local oscillator source supported on said motherboard structure and generating a local oscillator LO signal;
 the motherboard configured to receive the local oscillator signal from the local oscillator signal source and transmit said local oscillator LO signal through the motherboard to each of the frequency converters;
 said frequency converters each configured to convert the respective RF input signal to a respective RF output signal using said local oscillator signal and to transmit the RF output signal to the antenna system so as to be transmitted wirelessly; and
 wherein the motherboard supports a second LO signal source wired in parallel with the first LO signal source so as to supply a second LO signal to the frequency converters via the motherboard in the event of failure of the first LO signal source.

15. The invention according to claim 14, wherein the motherboard is supported on a base plate, said base plate having a side with a recess configured to receive the motherboard therein, and the payload area of the satellite including a generally planar surface to which said base plate is secured so as to cover the motherboard;
 the base plate having apertures therein aligning with sockets on the motherboard, said frequency converters connecting electrically to said sockets on the motherboard through said apertures.

16. The invention according to claim 15, wherein one or more bolts extend through the motherboard and are secured to the surface of the payload area, said bolts extending through support members in apertures in the motherboard, said support members supporting the motherboard on the surface of the payload area.

17. The invention according to claim 3, wherein the motherboard includes strip lines connected so as to carry the LO signal from the LO signal source to each of the frequency converters.

18. A motherboard structure configured for use in a satellite, said motherboard structure including:
 a motherboard having a layered structure including a plurality of layers of conductive material interlying with each other and separated from each other by material having insulative or capacitave properties;
 a support structure secured to said motherboard;
 a power supply module supported on the support structure and electrically connected to the motherboard so as to supply one or more electrical currents thereto;
 a LO signal generator supported on the support structure and electrically connected to the motherboard so as to supply an LO signal having a first frequency to the motherboard;
 eight frequency converters supported on the support structure and each connected with an antenna system so as to each receive therefrom a respective incoming RF signal, each of said frequency converters being electrically connected with the motherboard;
 the motherboard having a first circuitry arrangement extending via a set of the layers thereof, said first circuitry arrangement carrying electrical current from the power supply to the LO signal generator and to the frequency converters so as to provide power for the operation thereof;
 the motherboard having a second circuitry arrangement extending via a second set of layers thereof, said second circuitry arrangement being configured as a strip line carrying the LO signal from the LO signal generator to the frequency converters, said strip line having a plurality of splitters dividing the LO signal into eight derivative LO signals, each supplied to a respective frequency converter;
 each of the frequency converters converting the respective incoming RF signal using the LO signal and producing a respective output RF signal, said frequency converters each transmitting the output RF signal to an antenna transmission system;

wherein the support structure is a plate member having a recess receiving the motherboard therein, said plate member being affixed to a planar portion of the satellite with the motherboard secured therebetween; and the frequency converters, the power supply and the LO signal generator all being secured to an outer surface of the plate member and each being plugged into the motherboard through apertures in the plate member through which sockets on the motherboard are accessible, the sockets including a coaxial push-plug connection for each of the frequency converters and for the LO signal generator through which plugs the LO signal is transmitted.

19. The invention according to claim 18, and further comprising a second LO signal generator and a second power supply connected in parallel with the first LO signal generator and the first power supply, respectively, said second LO signal generator and the second power supply being configured to transmit a second LO signal or additional electrical power in the event of a failure of the first LO signal generator or the first power supply, respectively.

20. The invention according to claim 18, wherein the LO signal generator is a PLVCO operating with a TCXO, both of which are supported on the motherboard support structure and receive electrical power from the motherboard.

21. A motherboard structure configured for use in a satellite, said motherboard structure including:

a motherboard having a layered structure including a plurality of layers of conductive material interlying with each other and separated from each other by material having insulative or capacitave properties;

a support structure secured to said motherboard;

a power supply module supported on the support structure and electrically connected to the motherboard so as to supply one or more electrical currents thereto;

a LO signal generator supported on the support structure and electrically connected to the motherboard so as to supply an LO signal having a first frequency to the motherboard;

eight frequency converters supported on the support structure and each connected with an antenna system so as to each receive therefrom a respective incoming RF signal, each of said frequency converters being electrically connected with the motherboard;

the motherboard having a first circuitry arrangement extending via a set of the layers thereof, said first circuitry arrangement carrying electrical current from the power supply to the LO signal generator and to the frequency converters so as to provide power for the operation thereof;

the motherboard having a second circuitry arrangement extending via a second set of layers thereof, said second circuitry arrangement being configured as a strip line carrying the LO signal from the LO signal generator to the frequency converters, said strip line having a plurality of splitters dividing the LO signal into eight derivative LO signals, each supplied to a respective frequency converter;

each of the frequency converters converting the respective incoming RF signal using the LO signal and producing a respective output RF signal, said frequency converters each transmitting the output RF signal to an antenna transmission system;

wherein a further eight frequency converters and a second LO signal generator are supported on the support member, and the motherboard carries electrical power to all sixteen of the frequency converters and both of the LO signal generators from said power supply; and the motherboard receives a second LO signal from the second LO signal generator and transmits it split into eight divided LO signals to the further eight frequency converters via strip lines and splitters in the same set of layers as for transmitting the first LO signal.

* * * * *